(12) United States Patent
Akiyama

(10) Patent No.: US 9,548,465 B2
(45) Date of Patent: Jan. 17, 2017

(54) ELECTRONIC DEVICE, IMAGE DISPLAY APPARATUS, AND SUBSTRATE FOR CONFIGURING IMAGE DISPLAY APPARATUS

(71) Applicant: Sony Corporation, Tokyo (JP)

(72) Inventor: Ryuto Akiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 8 days.

(21) Appl. No.: 14/456,847

(22) Filed: Aug. 11, 2014

(65) Prior Publication Data
US 2015/0053954 A1    Feb. 26, 2015

(30) Foreign Application Priority Data

Aug. 20, 2013   (JP) .................. 2013-170615

(51) Int. Cl.
| | |
|---|---|
| *H01L 29/08* | (2006.01) |
| *H01L 35/24* | (2006.01) |
| *H01L 51/00* | (2006.01) |
| *H01L 51/10* | (2006.01) |
| *H01L 51/05* | (2006.01) |

(52) U.S. Cl.
CPC ......... *H01L 51/107* (2013.01); *H01L 51/0545* (2013.01)

(58) Field of Classification Search
CPC ............... H01L 51/107; H01L 51/0545; H01L 51/5012; H01L 51/5056; H01L 51/5206

USPC .............................. 257/40, 98–100, E51.005
See application file for complete search history.

(56) References Cited

U.S. PATENT DOCUMENTS

| | | | | |
|---|---|---|---|---|
| 2006/0099526 A1* | 5/2006 | Yang | ..................... | H01L 27/283 430/58.5 |
| 2009/0146235 A1* | 6/2009 | Kawasaki | ..................... | 257/432 |
| 2012/0319116 A1* | 12/2012 | Ono et al. | ........................ | 257/59 |

FOREIGN PATENT DOCUMENTS

JP        2013-030730 A      2/2013

* cited by examiner

*Primary Examiner* — Calvin Choi

(74) *Attorney, Agent, or Firm* — Wolf, Greenfield & Sacks, P.C.

(57) ABSTRACT

An electronic device includes a first electrode and a second electrode which are separately formed on a base; a functional layer which includes an organic semiconductor material layer, and is formed on the base between the first electrode and the second electrode; a functional layer extension portion which includes the organic semiconductor material layer, and extends from the functional layer; a protective film which is formed at least on the functional layer; and an insulating layer which covers an entire surface, in which the protective film is patterned to include at least two sides which intersect with each other at an acute angle, and a vertex portion of the protective film in which the two sides intersect with each other, is chamfered.

15 Claims, 21 Drawing Sheets

ELECTRONIC DEVICE, IMAGE DISPLAY APPARATUS, AND SUBSTRATE FOR CONFIGURING IMAGE DISPLAY APPARATUS

CROSS REFERENCE TO RELATED APPLICATIONS

This application claims the benefit of Japanese Priority Patent Application JP 2013-170615 filed Aug. 20, 2013, the entire contents of which are incorporated herein by reference.

BACKGROUND

The present disclosure relates to an electronic device, an image display apparatus, and a substrate for configuring an image display apparatus.

Currently, an electric field effect transistor (FET) including a Thin Film Transistor (TFT) which is used in a great number of electronic devices includes, for example, a gate electrode formed on a support, a $SiO_2$ gate insulating layer formed on the support including the gate electrode, and a channel forming region and a source/drain electrode formed on the gate insulating layer. Then, in general, an extremely expensive semiconductor manufacturing apparatus is used for manufacturing the electric field effect transistor including such a configuration, and thus there is a strong demand for reducing the production cost.

Meanwhile, recently, an electronic device using an organic semiconductor material layer in a functional layer has been rapidly developed, and among the electronic devices, an organic electronic device (hereinafter, simply referred to as "organic device") such as an organic transistor is attracting attention. Examples of an eventual goal of the organic device may include low cost, being lightweight, flexibility, and high performance. An organic semiconductor material for configuring the organic semiconductor material layer has the following advantages, compared to a silicon-based inorganic material.

(1) It is possible to manufacture a large-area organic device by a simple process at low temperature and low cost.

(2) It is possible to manufacture the organic device having flexibility.

(3) It is possible to control performance or physical properties of the organic device by modifying molecules for configuring the organic material to a desired configuration. Then, particularly, a coating film forming method such as a printing method at low temperature is considered as the simple process.

However, the organic semiconductor material layer is altered due to oxygen and moisture which penetrate from the outside, and the performance of the organic device may be degraded. For this reason, it is necessary that the organic semiconductor material layer be blocked from the outside by an insulating layer such as a passivation film in order to manufacture an organic device having high reliability. Nevertheless, when the insulating layer is directly formed on the functional layer made of the organic semiconductor material layer, the functional layer may be damaged, and device characteristics may be degraded.

A technology for preventing such a problem from being generated is known from, for example, Japanese Unexamined Patent Application Publication No. 2013-030730. In the technology disclosed in Japanese Unexamined Patent Application Publication No. 2013-030730, a protective film made of a fluorine resin or the like is formed on an organic semiconductor material layer, and then an insulating layer (a passivation film) is formed thereon. The protective film is patterned in the shape of a desired plane.

SUMMARY

In the technology disclosed in Japanese Unexamined Patent Application Publication No. 2013-030730, it is possible to effectively protect the organic semiconductor material layer, but when the insulating layer is formed by, for example, a spin coat method after forming the protective film, the patterned protective film may be peeled off from a foundation. When the protective film is not patterned, the protective film is prevented from being peeled off, but in this case, a problem of adhesiveness between the insulating layer and the protective film may be generated.

Accordingly, it is desired to provide an electronic device of a configuration and a structure in which a functional layer including an organic semiconductor material layer is reliably protected, and high adhesiveness is able to be secured in an insulating layer for covering the entire surface of the electronic device, and an image display apparatus and a substrate for configuring an image display apparatus which are provided with the electronic device.

An electronic device according to a first embodiment of the present disclosure is a so-called bottom contact-type electronic device, and includes a first electrode and a second electrode which are separately formed on a base; a functional layer which includes an organic semiconductor material layer, and is formed on the base between the first electrode and the second electrode; a functional layer extension portion which includes the organic semiconductor material layer, and extends from the functional layer; a protective film which is formed at least on the functional layer; and an insulating layer which covers an entire surface, and the protective film is patterned in order to include at least two sides intersecting with each other at an acute angle, and a vertex portion of the protective film in which the two sides intersect with each other, is chamfered.

An electronic device according to a second embodiment of the present disclosure is a so-called top contact-type electronic device, and includes a functional layer which includes an organic semiconductor material layer, and is formed on a base; a functional layer extension portion which includes the organic semiconductor material layer, and extends from the functional layer; a first electrode and a second electrode which are separately formed on the functional layer extension portion, and interpose the functional layer; a protective film which is formed at least on the functional layer therebetween; and an insulating layer which covers an entire surface, and the protective film is patterned in order to include at least two sides intersecting with each other at an acute angle, and a vertex portion of the protective film in which the two sides intersect with each other, is chamfered.

A substrate for configuring an image display apparatus of the embodiment of the present disclosure is a substrate in which a plurality of electronic devices according to the first embodiment or the second embodiment of the present disclosure are arranged in the shape of a 2-dimensional matrix in a first direction and a second direction.

An image display apparatus of the embodiment of the present disclosure includes the substrate for configuring an image display apparatus of the present disclosure.

In the electronic device of the embodiment of the present disclosure, that is, the electronic device which is provided in the image display apparatus and the substrate for configuring an image display apparatus of the embodiment of the present disclosure, the protective film is patterned in order to include at least two sides intersecting with each other at an acute angle, and the vertex portion of the protective film in which the two sides intersect with each other is chamfered, and thus it is possible to prevent the protective film from being peeled off at the time of forming the insulating layer, and it is possible to reliably protect the functional layer. Furthermore, since the protective film is patterned, it is possible to secure high adhesiveness in the insulating layer for covering the entire surface of the electronic device. Furthermore, the effects disclosed herein are merely exemplifications and not limited. In addition, additional effects may be obtained.

BRIEF DESCRIPTION OF THE DRAWINGS

FIG. 1A and FIG. 1B are a schematic partial sectional view of an electronic device according to Example 1, and a schematic view illustrating an arrangement of a functional layer or the like;

FIG. 2A and FIG. 2B are a schematic partial sectional view of a modification of the electronic device according to Example 1, and a schematic view illustrating an arrangement of a functional layer or the like;

FIG. 3A and FIG. 3B are a schematic partial sectional view of another modification of the electronic device according to Example 1, and a schematic view illustrating an arrangement of a functional layer or the like;

FIG. 4A and FIG. 4B are a schematic partial sectional view of yet another modification of the electronic device according to Example 1, and a schematic view illustrating an arrangement of a functional layer or the like;

FIG. 5A and FIG. 5B are a schematic partial sectional view of an electronic device according to Example 2, and a schematic view illustrating an arrangement of a functional layer or the like;

FIG. 6A and FIG. 6B are a schematic partial sectional view of a modification of the electronic device according to Example 2, and a schematic view illustrating an arrangement of a functional layer or the like;

FIG. 7A and FIG. 7B are a schematic partial sectional view of another modification of the electronic device according to Example 2, and a schematic view illustrating an arrangement of a functional layer or the like;

FIG. 8A and FIG. 8B are a schematic partial sectional view of yet another modification of the electronic device according to Example 2, and a schematic view illustrating an arrangement of a functional layer or the like;

FIG. 9A and FIG. 9B are a schematic partial sectional view of an electronic device according to Example 3, and a schematic view illustrating an arrangement of a functional layer or the like;

FIG. 10A and FIG. 10B are a schematic partial sectional view of a modification of the electronic device according to Example 3, and a schematic view illustrating an arrangement of a functional layer or the like;

FIG. 11A and FIG. 11B are a schematic partial sectional view of another modification of the electronic device according to Example 3, and a schematic view illustrating an arrangement of a functional layer or the like;

FIG. 12A and FIG. 12B are a schematic partial sectional view of yet another modification of the electronic device according to Example 3, and a schematic view illustrating an arrangement of a functional layer or the like;

FIG. 13A and FIG. 13B are a schematic partial sectional view of an electronic device according to Example 4, and a schematic view illustrating an arrangement of a functional layer or the like;

FIG. 14A and FIG. 14B are a schematic partial sectional view of a modification of the electronic device according to Example 4, and a schematic view illustrating an arrangement of a functional layer or the like;

FIG. 15A and FIG. 15B are a schematic partial sectional view of another modification of the electronic device according to Example 4, and a schematic view illustrating an arrangement of a functional layer or the like;

FIG. 16A and FIG. 16B are a schematic partial sectional view of yet another modification of the electronic device according to Example 4, and a schematic view illustrating an arrangement of a functional layer or the like;

DETAILED DESCRIPTION OF EMBODIMENTS

Figure 1A:
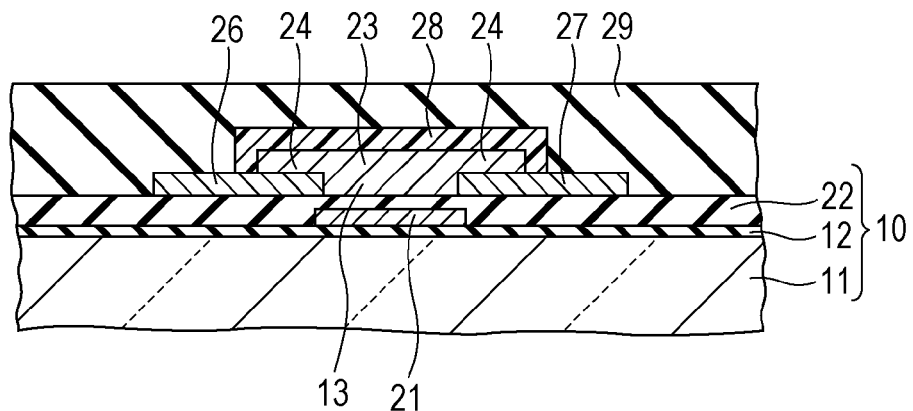

Hereinafter, the present disclosure will be described on the basis of embodiments with reference to the drawings, but the present disclosure is not limited to the embodiments, and various values and materials in the embodiments are exemplifications. Furthermore, the description will be performed in the following order.

1. Description of Electronic Device, Image Display Apparatus, and Substrate for Configuring Image Display Apparatus according to First Embodiment and Second Embodiment of the Present Disclosure in General 2. Example 1 (Electronic Device (Bottom Contact/Bottom Gate-type), Image Display Apparatus, and Substrate for Configuring Image Display Apparatus according to First Embodiment of the Present Disclosure)

3. Example 2 (Electronic Device (Bottom Contact/Top Gate-type), Image Display Apparatus, and Substrate for Configuring Image Display Apparatus according to First Embodiment of the Present Disclosure)

4. Example 3 (Electronic Device (Top Contact/Bottom Gate-type), Image Display Apparatus, and Substrate for Configuring Image Display Apparatus according to Second Embodiment of the Present Disclosure)

5. Example 4 (Electronic Device (Top Contact/Top Gate-type), Image Display Apparatus, and Substrate for Configuring Image Display Apparatus according to Second Embodiment of the Present Disclosure), and Others Description of Electronic Device, Image Display Apparatus, and Substrate for Configuring Image Display Apparatus according to First Embodiment and Second Embodiment of the Present Disclosure in General The electronic device according to the first embodiment of the present disclosure, and the electronic device according to the first embodiment of the present disclosure in the image display apparatus and the substrate for configuring an image display apparatus of the present disclosure may be collectively referred to as "electronic device or the like according to the first embodiment of the present disclosure", and the electronic device according to the second embodiment of the present disclosure, and the electronic device according to the second embodiment of the present disclosure in the image display apparatus and the substrate for configuring an image display apparatus of the present disclosure may be referred to as "electronic device or the like according to the second embodiment of the present disclosure".

In the electronic device or the like according to the first embodiment of the present disclosure or the electronic device or the like according to the second embodiment of the present disclosure, all of the vertex portions of the protective film in which sides intersect with each other at an acute angle may be chamfered.

In the electronic device or the like according to the first embodiment of the present disclosure including the preferable configuration described above, an outline of the functional layer extension portion may be configured to have a closed curve, and the protective film may cover the functional layer and the functional layer extension portion, or may be formed on a part of the functional layer extension portion and on the functional layer, or may be formed on the functional layer.

Alternatively, an inactive region including the organic semiconductor material layer in which an inactivation process is performed, may extend from the functional layer extension portion. Then, in this case, the protective film may cover the functional layer and the functional layer extension portion, or may be formed on a part of the functional layer extension portion and on the functional layer, or may be formed on the functional layer.

The electronic device or the like according to the first embodiment of the present disclosure may be a so-called 2-terminal electronic device, and may further include a control electrode. That is, the electronic device of the latter configuration is a so-called 3-terminal electronic device.

That is, in the electronic device or the like according to the first embodiment of the present disclosure including various preferable configurations described above, a base may include a control electrode formed on the substrate for manufacturing an electronic device, and an interlayer insulating layer for covering the control electrode, and the control electrode may face the functional layer through the interlayer insulating layer. Specifically, the electronic device may include a thin film transistor, the control electrode may correspond to a gate electrode, the interlayer insulating layer may correspond to a gate insulating layer, the first electrode and the second electrode may correspond to a source/drain electrode, and the functional layer may correspond to a channel forming region.

Alternatively, a control electrode which faces the functional layer through the insulating layer may be further included. Specifically, the electronic device may include a thin film transistor, the control electrode may correspond to the gate electrode, the insulating layer may correspond to the gate insulating layer, the first electrode and the second electrode may correspond to the source/drain electrode, and the functional layer may correspond to the channel forming region.

In the electronic device or the like according to the second embodiment of the present disclosure including the preferable configuration described above, an outline of the functional layer extension portion may be configured to have a closed curve, and the protective film may cover the functional layer and the functional layer extension portion, or may be formed on a part of the functional layer extension portion and on the functional layer, or may be formed on the functional layer.

Alternatively, an inactive region including the organic semiconductor material layer in which an inactivation process is performed, may extend from the functional layer extension portion.

The electronic device or the like according to the second embodiment of the present disclosure may be a so-called 2-terminal electronic device, and may further include a control electrode. That is, the electronic device of the latter configuration is a so-called 3-terminal electronic device.

That is, in the electronic device or the like according to the second embodiment of the present disclosure including the various preferable configurations described above, the base may include a control electrode formed on the substrate for manufacturing an electronic device, and an interlayer insulating layer for covering the control electrode, and the control electrode may face the functional layer through the interlayer insulating layer. Specifically, the electronic device may include a thin film transistor, the control electrode may correspond to a gate electrode, the interlayer insulating layer may correspond to a gate insulating layer, the first electrode and the second electrode may correspond to a source/drain electrode, and the functional layer may correspond to a channel forming region.

Alternatively, a control electrode which faces the functional layer through the insulating layer may be further included. Specifically, the electronic device may include a thin film transistor, the control electrode may correspond to the gate electrode, the insulating layer may correspond to the gate insulating layer, the first electrode and the second electrode may correspond to the source/drain electrode, and the functional layer may correspond to the channel forming region.

Hereinafter, the electronic device or the like according to the first embodiment of the present disclosure and the electronic device or the like according to the second embodiment of the present disclosure which include the various preferable configurations described above, may be collectively and simply referred to as "electronic device or the like of the present disclosure".

In the substrate (a backplane) for configuring an image display apparatus of the present disclosure including a plurality of electronic devices of the present disclosure, the control electrode of the plurality of electronic devices which are arranged along a first direction may be connected to gate wiring extending along the first direction, and the first electrode or the second electrode of the plurality of electronic devices arranged along a second direction may be connected to signal wiring extending along the second direction.

As a shape of the chamfered portion of the electronic device or the like of the present disclosure, an arc, a part of a smooth curve, one line segment, a combination of a plurality of line segments, and a combination of a line segment and a part of a curve may be included. In addition, as described above, it is preferable that all of the vertex portions of the protective film in which sides intersect with each other at an acute angle be chamfered, but only a part of a plurality of vertex portions may be chamfered according to a case, and in this case, it is preferable that the vertex portion of a side which is close to the center of the substrate (or the backplane) for manufacturing an electronic device be chamfered, in each electronic device. When the outline of the functional layer extension portion is configured to have a closed curve, in the closed curve, specifically, in a simple closed curve (referred to as a Jordan closed curve), a combination of line segments, and a combination of a curve and a line segment are included.

A material for configuring the protective film of the electronic device or the like of the present disclosure may be a material which does not degrade the organic semiconductor material layer at the time of forming the protective layer, and as the material for configuring the protective film, for example, a fluorinated polyolefin, a condensed fluorine-containing polymer such as a fluorine-containing acrylic resin or a fluorine-containing polyimide resin, a fluorine-containing ether polymer, a fluorine-containing cyclic ether polymer, and a copolymer thereof, polyvinyl alcohol (PVA), a perylene resin, and the like may be included. As a forming method of the protective film, an evaporation method, or a coating method described below may be included. The patterning of the protective film depends on the material configuring the protective film, but various etching methods may be used, and a protective film having a desired outline shape may be formed according to the coating method without performing the patterning. The simplest outline shape of the protective film is rectangular, but the shape is not limited thereto, and the outline shape may be determined on the basis of the specification necessary in the electronic device.

As the applying method, a method for applying a liquid material such as various printing methods such as a screen printing method or an ink jet printing method, an offset printing method, a reverse offset printing method, a gravure printing method, a gravure offset printing method, an anastatic printing, a flexo printing, and a micro contact method; a spin coat method; various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spool coater method, a slit coater method, a slit orifice coater method, a cap coat method, a calender coater method, a casting method, a capillary coater method, a bar coater method, and a dipping method; a spray method; a method using a dispenser; and a stamp method, may be included.

In addition, in the electronic device or the like of the present disclosure, the insulating layer may be a single layer or a multi-layer. As a material for configuring the insulating layer, an organic insulating material may be included. Specifically, as the organic insulating material, an organic-based insulating material such as polymethylmethacrylate (PMMA) or polyvinylphenol (PVP), polyvinyl alcohol (PVA), polyvinyl acetate, polyurethane, polyimide, polyamide, polyester, polysulfone, polyvinylidene fluoride, cyanoethylpullulan, polycarbonate (PC), polyethyleneterephthalate (PET), polystyrene, a silanol derivative (a silane coupling agent) such as N-2(aminoethyl)-3-aminopropyltrimethoxysilane (AEAPTMS), 3-mercaptopropyltrimethoxysilane (MPTMS), and octadecyltrichlorosilane (OTS), an epoxy resin, a bezocyclobutene resin, a phenol resin, an acrylic resin, or a polymer alloy or a copolymer of the resins may be included, and a combination thereof may be used. As the forming method of the insulating layer, the various applying methods described above may be included. In addition, a visible light curing resin cured by visible light or ultraviolet ray, and an electromagnetic wave such as electron beam, an ultraviolet ray curing resin, an electron beam curing resin, or a thermosetting resin cured by heat may be used. The patterning of the insulating layer depends on the material for configuring the insulating layer, but various etching methods may be used, and an insulating layer having a desired outline shape may be formed according to the applying method without performing the patterning. The simplest outline shape of the insulating layer is rectangular, but the shape is not limited thereto, and the outline shape may be determined on the basis of the specification necessary in the electronic device. In the bottom gate-type electronic device, the insulating layer may be configured by an inorganic insulating film material (for example, silicon oxide, silicon nitride, strontium titanate, or the like), and may be formed by a PVD method or a CVD method.

By laser irradiation in which irradiation conditions are optimized, crystallizability of the organic semiconductor material layer decreases, and thus it is possible to obtain the inactive region. Alternatively, the inactive region may be obtained by a plasma treatment for changing a crystal structure and a chemical structure of the organic semiconductor material layer, an oxidant treatment for changing the chemical structure of the organic semiconductor material layer, or the like. Here, the inactive region indicates a region which does not function as the functional layer.

In the electronic device or the like of the present disclosure, as a material for configuring the control electrode, the first electrode, the second electrode, the gate electrode, or the source/drain electrode (hereinafter, collectively referred to as "control electrode or the like"), a metal such as platinum (Pt), gold (Au), palladium (Pd), chromium (Cr), molybdenum (Mo), nickel (Ni), aluminum (Al), silver (Ag), tantalum (Ta), tungsten (W), copper (Cu), titanium (Ti), indium (In), tin (Sn), iron (Fe), cobalt (Co), zinc (Zn), magnesium (Mg), manganese (Mn), ruthenium (Rh), and rubidium (Rb), or a conductive substance such as an alloy including these metal elements, conductive particles of these metals or an alloy including these metals, ITO, and polysilicon including an impurity may be included, and a laminated structure (for example, $MoO_x$/Au, CuO/Au) of layers including these elements may be formed. Further, as the material for configuring the control electrode or the like, an organic material (electroconductive polymer) such as poly (3,4-ethylenedioxythiophene)/polystyrenesulfonic acid (PEDOT/PSS) or TTF-TCNQ, and polyaniline may be included. The material for configuring the control electrode, the first electrode, the second electrode, the gate electrode, and the source/drain electrode may be the same material or a different material from each other.

The forming method of the control electrode or the like depends on the material configuring the control electrode, but any one of various applying methods described above, a physical vapor deposition method (a PVD method), a pulsed laser deposition method (PLD), an arc discharge method, various chemical vapor deposition methods (a CVD method) including an MOCVD method, a lift off method, a shadow mask method, and a plating method such as an electrolysis plating method or a non-electrolysis plating method, or a combination thereof, and as necessary, a combination with a patterning technology may be included, and various applying methods using ink or paste may be included as the forming method of the control electrode or the like. Furthermore, as the PVD method, (a) various vacuum evaporation methods such as an electron beam heating method, a resistance heating method, a flash evaporation, and a method for heating a crucible, (b) a plasma evaporation method, (c)

various sputtering methods such as a bipolar sputtering method, a direct current (DC) sputtering method, a DC magnetron sputtering method, a high-frequency sputtering method, a magnetron sputtering method, an ion beam sputtering method, a bias sputtering method, and (d) various ion plating methods such as a direct current (DC) method, an RF method, a multiple negative pole method, an activated reaction method, an electric field evaporation method, a high-frequency ion plating method, and a reactive ion plating method may be included. When a resist pattern is formed to perform the patterning, for example, a resist layer is formed by applying a resist material, and then the resist layer is patterned by using a photolithography technology, a laser drawing technology, an electron beam drawing technology or an X-ray drawing technology, or the like. The resist pattern may be formed by using a resist transfer method or the like. When the control electrode or the like is formed on the basis of the etching method, a dry etching method or a wet etching method may be adopted, and as the dry etching method, for example, ion milling or reactive ion etching (RIE) may be included. In addition, the control electrode or the like may be formed on the basis of a laser ablation method, a mask evaporation method, a laser transfer method, or the like.

In the electronic device or the like of the present disclosure, the interlayer insulating layer or the gate insulating layer (hereinafter, collectively and simply referred to as "interlayer insulating layer or the like") may be a single layer or a multi-layer. As a material for configuring the interlayer insulating layer or the like, an inorganic insulating material and an organic insulating material may be included. As the inorganic insulating material, a silicon oxide-based material, silicon nitride ($SiN_Y$), aluminum oxide ($Al_2O_3$) or a metallic oxide high-dielectric constant insulating material such as titanium oxide, and $HfO_2$ may be included. In addition, as the organic insulating material, an organic-based insulating material such as polymethylmethacrylate (PMMA) or polyvinylphenol (PVP), polyvinyl alcohol (PVA), polyimide, polycarbonate (PC), polyethyleneterephthalate (PET), polystyrene, a silanol derivative (a silane coupling agent) such as N-2(aminoethyl)-3-aminopropyltrimethoxysilane (AEAPTMS), 3-mercaptopropyltrimethoxysilane (MPTMS), and octadecyltrichlorosilane (OTS), an organic-based insulating material (organic polymer) such as straight chain hydrocarbons in which a functional group which is able to be coupled to the gate electrode is included in one end of octadecanethiol, dodecyl isocyanate, or the like, may be included, and a combination thereof may be used. Here, as the silicon oxide-based material, silicon oxide ($SiO_X$), BPSG, PSG, BSG, AsSG, PbSG, silicon oxynitride (SiON), spin on glass (SOG), and a low-dielectric constant $SiO_2$-based material (for example, polyarylether, a cyclofluorocarbon polymer and benzocyclobutene, a cyclic fluorine-based resin, polytetrafluoroethylene, arylfluoride ether, polyimide fluoride, amorphous carbon, and organic SOG) may be illustrated. In addition, as the forming method of the interlayer insulating layer or the like, in addition to the applying methods described above, any one of the various PVD methods or CVD methods described above, a sol-gel method, the lift off method, the shadow mask method, and an electro deposition method, and as necessary a combination with the patterning technology, may be included, and the patterning may be performed on the basis of the laser ablation method, or may be performed by exposing and developing with a photosensitive material.

In the electronic device or the like of the present disclosure, as the organic semiconductor material for configuring the organic semiconductor material layer, polythiophene and derivatives thereof, poly-3-hexylthiophene (P3HT) in which a hexyl group is introduced to the polythiophene, pentacene (2,3,6,7-dibenzoanthracene), a pentacene derivative (triisopropylsilylethynyl (TIPS)-pentacene or the like), a dioxaanthanthrene-based compound such as 6,12-dioxaanthanthrene (so-called perixanthenoxanthene, and 6,12-dioxaanthanthrene, and referred to as "PXX"), polyanthracene, naphthacene, hexacene, heptacene, dibenzopentacene, tetrabenzopentacene, chrysene, perylene, coronene, terrylene, ovalene, quaterrylene, circumanthracene, benzopyrene, dibenzopyrene, triphenylene, polypyrrole and derivatives thereof, polyaniline and derivatives thereof, polyacetylenes, polydiacetylenes, polyazulenes, polyphenylene, polyfurans, polyindole, polyvinylcarbazole, polyselenophenes, polytellurophene, isothianaphtenes such as polyisothianaphtene, thienylenevinylenes such as polythienylenevinylene, polycarbazoles, polyphenylenesulfide, polyphenylenevinylene, polyphenylenesulfide, polyvinylenesulfide, polythienylenevinylene, polynaphthalene, polypyrene, polyazulene, phthalocyanine, merocyanine, and hemicyanine which are represented by copper phthalocyanine, polyethylenedioxythiophene, pyridazine, naphthalene tetracarboxylic acid diimide, poly(3,4-ethylenedioxythiophene)/polystyrenesulfonic acid (PEDOT/PSS), and quinacridone may be illustrated. Alternatively, as the organic semiconductor material, compounds selected from a group consisting of a condensed polycyclic aromatic compound, a porphyrin-based derivative, a phenylvinylidene-based conjugated oligomer, and a thiophene-based conjugated oligomer may be included. Specifically, for example, a condensed polycyclic aromatic compound such as an acene-based molecule (pentacene, tetracene, or the like), a porphyrin-based molecule, and a conjugated oligomer (phenylvinylidene-based or thiophene-based) may be included.

Alternatively, as the organic semiconductor material, for example, porphyrin, 4,4'-biphenyldithiol (BPDT), 4,4'-diisocyanobiphenyl, 4,4'-diisocyano-p-terphenyl, 2,5-bis(5'-thioacetyl-2'-thiophenyl)thiophene, 2,5-bis(5'-thioacetoxyl-2'-thiophenyl)thiophene, 4,4'-diisocyanophenyl, benzidine (biphenyl-4,4'-diamine), TCNQ (tetracyanoquinodimethane), a charge transfer complex which is represented by tetrathiafulvalene (TTF)-TCNQ complex, bisethylenetetrathiafulvalene (BEDTTTF)-perchloric acid complex, BEDTTTF-iodine complex, TCNQ-iodine complex, biphenyl-4,4'-dicarboxylic acid, 1,4-di(4-thiophenylacetylenyl)-2-ethylbenzene, 1,4-di(4-isocyanophenylacetylenyl)-2-ethylbenzene, a dendrimer, a fullerene such as C60, C70, C76, C78, and C84, 1,4-di(4-thiophenylethynyl)-2-ethylbenzene, 2,2"-dihydroxy-1,1':4', 1"-terphenyl, 4,4'-biphenyldiethanal, 4,4'-biphenyldiol, 4,4'-biphenyldiisocyanate, 1,4-diacetinylbenzene, diethylbiphenyl-4,4'-dicarboxylate, benzo(1,2-c; 3,4-c'; 5,6-c")tris(1,2)dithiol-1,4,7-trithione, alpha-sexithiophene, tetrathiotetracene, tetraselenotetracene, tetratellurium tetracene, poly(3-alkylthiophene), poly(3-thiophene-β-ethanesulfonic acid), poly(N-alkylpyrrole)poly(3-alkylpyrrole), poly(3,4-dialkylpyrrole), poly(2,2'-thienylpyrrole), and poly(dibenzothiophenesulfide) may be illustrated.

In the organic semiconductor material, polymer may be included as necessary. It is preferable that the polymer be dissolved in organic solvent. Specifically, as the polymer (an organic coupling agent, a binder), polystyrene, polyalphamethylstyrene, and polyolefin may be illustrated. Further, according to a case, additive (for example, a so-called doping material such as n-type impurity or p-type impurity) may be added.

As the solvent for preparing the organic semiconductor material solution, aromatic types such as toluene, xylene, mesitylene, and tetralin, ketones such as cyclopentanone, and cyclohexanone, hydrocarbons such as decalin, or the like may be illustrated. Among them, using a solvent such as mesitylene, tetralin, and decalin, which have a relatively high boiling point is preferable in terms of transistor characteristics, and in terms of preventing the organic semiconductor material from being rapidly dried at the time of forming the organic semiconductor material layer.

As the forming method of the organic semiconductor material layer, an applying method may be included. Here, any general applying method may be used as the applying method without problems, and specifically, for example, the various applying methods described above may be included. According to a case, the various PVD methods or CVD methods, or the like described above may be used. The organic semiconductor material layer may be patterned by, for example, the laser ablation method, the dry etching method, and the wet etching method, as necessary.

As laser light to be applied to the organic semiconductor material layer in order to pattern the organic semiconductor material layer on the basis of the laser ablation method, for example, laser light of wavelength 248 nm emitted from a KrF excimer laser, a fourth high-frequency (266 nm) of laser light of wavelength 1064 nm emitted from a YAG laser, and laser light of wavelength 308 nm emitted from a XeCl excimer laser may be included. The irradiation energy or irradiation time of the laser light to be applied to the organic semiconductor material layer may be suitably determined by various examinations. As an irradiation method of the laser light, a method in which the laser light is applied to the organic semiconductor material layer through a laser light shielding mask disposed on an upper portion of the organic semiconductor material layer at once, alternatively, for example, a method in which the laser light is sequentially applied to the organic semiconductor material layer according to the pattern of the organic semiconductor material layer, or the like may be illustrated. By adopting these methods, a region of the organic semiconductor material layer which is irradiated with the laser light may be suitably selected. Furthermore, as the laser light shielding mask of the former method, for example, a mask in which a region into which the laser light penetrates and a region which shields the laser light are formed on a glass plate or a quartz plate, a plastic film, a plastic plate, a metal plate, or the like may be used. In the region which shields the laser light, for example, a metal film such as chromium (Cr) may be formed. In addition, as the latter method, specifically, a method in which a laser light beam is serially applied to the organic semiconductor material layer in step movement (more specifically, a method in which a stage on which the substrate for manufacturing an electronic device is mounted, repeats movement for a predetermined distance and stopping, and the laser light beam is applied to the organic semiconductor material layer according to 2-dimensional scanning by combining a so-called raster scanning method or a so-called vector scanning method) may be included.

As the substrate for manufacturing an electronic device, a plastic film or a plastic sheet, and a plastic substrate which have flexibility and are configured by organic polymer such as polymethylmethacrylate (polymethylmethacrylate, PMMA), or polyvinyl alcohol (PVA), polyvinylphenol (PVP), polyethersulfone (PES), polyimide, polyamide, polyetherimide, polyetheretherketone, polyetherketone, polyacetal, polyarylate, polyphenylenesulfide, polycarbonate (PC), polyethyleneterephthalate (PET), polyethylenenaphthalate (PEN), polyethyletherketone, polyolefin, cellulose triacetate, a cycloolefin polymer, polyvinyl chloride, a liquid crystal polymer, an epoxy resin, a phenol resin, a urea resin, a melamine resin, and a silicone resin, may be included, and alternatively, mica may be included. When such an organic polymer having flexibility, and the material configured by a high-molecule-weight material are used, for example, the electronic device or the semiconductor device (TFT) may be combined or integrated with a curved-shaped image display apparatus or electronic apparatus. Alternatively, as the substrate for manufacturing an electronic device, various glass substrates, various glass substrates having an insulating film on a surface thereof, a quartz substrate, a quartz substrate having an insulating film on a surface thereof, a silicon substrate, a silicon substrate having an insulating film on a surface thereof, a sapphire substrate, a metal substrate made of various alloys or various metals such as stainless steel, aluminum, and nickel, a metallic foil, and paper may be included. As the substrate for manufacturing an electronic device, in addition, a conductive substrate (a substrate made of a metal such as gold or aluminum, a substrate made of high-orientation graphite, a stainless steel substrate, or the like) may be included. On the substrate for manufacturing an electronic device, a functional film such as a buffer layer for improving adhesiveness or flatness, or a barrier film for improving gas barrier properties may be formed. The substrate for manufacturing an electronic device absorbs the laser light used in the process, and when heating due to the absorption of the laser light becomes a problem, a layer which does not absorb the laser light (a laser light non-absorbable layer) or a layer in which it is difficult for the laser light to be absorbed (a laser light poorly absorbable layer) is disposed on the substrate for manufacturing an electronic device, and thus such a problem may be prevented from being generated. Furthermore, as a material for configuring the laser light non-absorbable layer or the laser light poorly absorbable layer, for example, silicon oxide $SiO_x$, silicon nitride $SiN_y$, silicon oxynitride $SiO_xN_y$, aluminum oxide $AlO_x$, polyethylene, polypropylene, PMMA, a fluorine-based resin, or the like may be included.

As a supporting member for supporting and maintaining the electronic device, the substrate for manufacturing an electronic device described above may be included, and a conductive substrate (a substrate made of various alloys or various metals such as a substrate made of a metal such as gold or aluminum, a substrate made of high-orientation graphite, and a stainless steel substrate) may be included. In addition, as a material for configuring the insulating film disposed on the supporting member, the material for configuring the gate insulating layer may be included, and an existing insulating film may be widely used.

The electronic device of the present disclosure, may include a so-called 3-terminal structure, and may include a 2-terminal structure. According to the electronic device including the 3-terminal structure, for example, the electric field effect transistor, more specifically, the thin film transistor (TFT) is configured, as described above. Alternatively, according to the electronic device including the 3-terminal structure, for example, a light-emitting element is configured. That is, a light-emitting element (an organic light-emitting element, and an organic light-emitting transistor) in which a functional layer emits light by applying voltage to the control electrode, and the first electrode and the second electrode, may be configured. In the electronic device, according to the voltage applied to the control electrode, current which flows from the first electrode to the functional layer toward the second electrode is controlled. Whether the electronic device functions as the electric field effect transistor or as the light-emitting element depends on a voltage applied state (bias) with respect to the first electrode and the second electrode. First, when bias of a range in which electron injection from the second electrode is not caused is applied, the control electrode is modulated, and thus the current flows from the first electrode to the second electrode. This is a transistor operation. On the other hand, when positive holes are sufficiently accumulated, and the bias with respect to the first electrode and the second electrode increases, the electron injection begins, and the light is emitted by recoupling the electrons with the positive holes. In addition, as the electronic device having the 2-terminal structure, a photoelectric conversion element in which the current flows between the first electrode and the second electrode by the light irradiation with respect to the functional layer, may be included.

The electronic device of the present disclosure may be used as a sensor. As the sensor, a light sensor, or a photoelectric conversion element (specifically, a solar cell or an image sensor) may be included. Specifically, as the organic semiconductor molecule for configuring the functional layer of the light sensor, a pigment having absorbency with respect to the light (including not only visible light, but also ultraviolet ray or infrared ray) may be used. In addition, in the photoelectric conversion element, the current flows between the first electrode and the second electrode due to the light (including not only visible light, but also ultraviolet ray or infrared ray) irradiation with respect to the functional layer. Furthermore, the photoelectric conversion element may also be configured by the electronic device having the 3-terminal structure, and in this case, the voltage may not be applied to the control electrode or may be applied to the control electrode, and in the latter case, the flowing current may be modulated by applying the voltage to the control electrode.

As an example of an apparatus in which the electronic device of the present disclosure is assembled, the image display apparatus may be illustrated, but it is not limited thereto. As the image display apparatus of the present disclosure, a liquid crystal display apparatus, an organic electroluminescence display apparatus, a plasma display apparatus, an electrophoresis display apparatus provided with an electrophoresis display element, a cold cathode field emission display apparatus, a display apparatus provided with a semiconductor light-emitting element such as a light-emitting diode, and the like may be illustrated. In addition, the image display apparatus may be, for example, various image display apparatuses (for example, the various image display apparatuses described above) in a so-called desktop-type personal computer, a laptop-type personal computer, a mobile-type personal computer, a tablet terminal including a tablet-type personal computer, a personal digital assistant (PDA), a car navigation system, a cellular phone or a smart phone, a game console, an electronic paper such as an electronic book, and an electronic newspaper, a sign board, a poster, a message board such as a blackboard, a copier, rewritable paper for printer paper replacement, a calculator, a display unit of home electrical appliances, a card display unit such as a point card, an electronic advertisement, an electronic POP, or the like may be included. In addition, various illuminating devices may be included.

When the electronic device of the present disclosure is applied to and used in the image display apparatus, and various electronic apparatus including electronic paper, and Radio Frequency Identification Cards (RFIDs) or the like, the electronic device of the present disclosure may be a monolithic integrated circuit in which a plurality of electronic devices are integrated in a supporting member, and may be used as a discrete component by cutting out each electronic device to be individualized. In addition, the electronic device may be sealed with a resin.

EXAMPLE 1

Figure 1B:
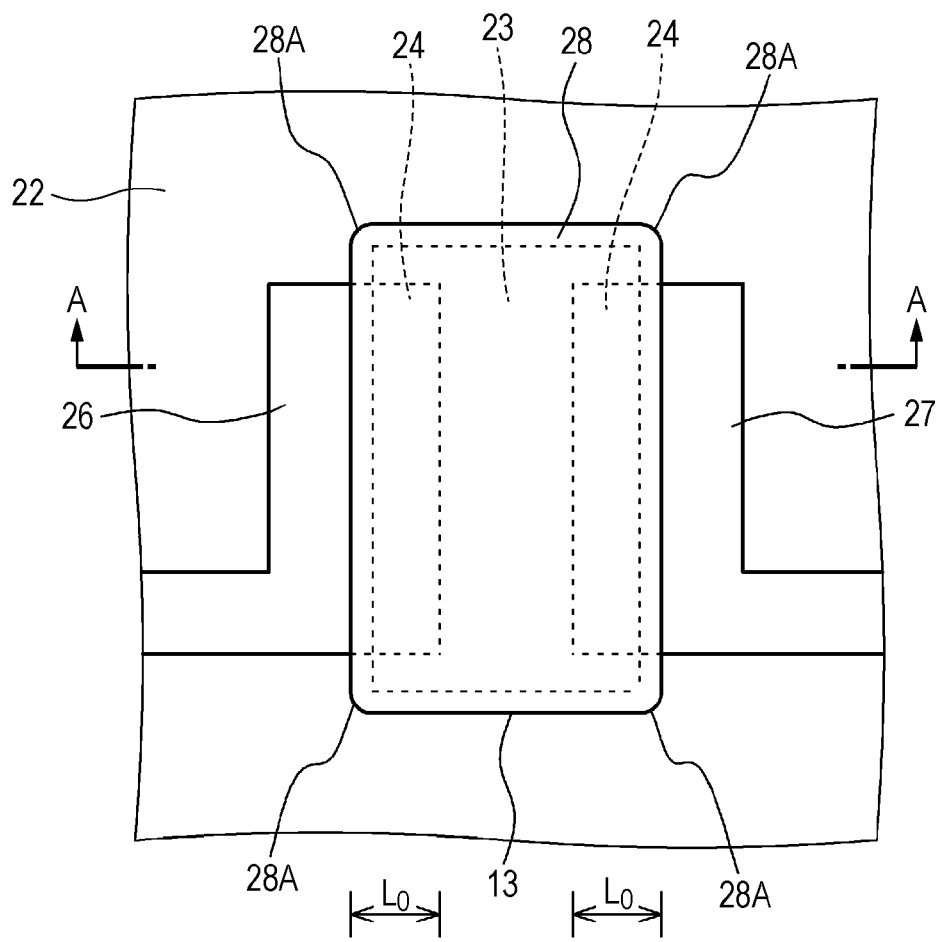

Example 1 relates to the electronic device according to the first embodiment of the present disclosure, specifically, to a bottom contact/bottom gate-type electronic device (more specifically, a thin film transistor, TFT which is a semiconductor device), and to the substrate for configuring an image display apparatus of the present disclosure, and to the image display apparatus of the present disclosure. A schematic partial sectional view of the electronic device according to Example 1 is illustrated in FIG. 1A, and a schematic view which illustrates an arrangement of a functional layer or the like is illustrated in FIG. 1B. Furthermore, the schematic partial sectional view of FIG. 1A is a partial sectional view cut along line A-A of FIG. 1B. In addition, schematic partial sectional views of the electronic devices illustrated in FIG. 2A, FIG. 3A, FIG. 4A, FIG. 5A, FIG. 6A, FIG. 7A, FIG. 8A, FIG. 9A, FIG. 10A, FIG. 11A, FIG. 12A, FIG. 13A, FIG. 14A, FIG. 15A, and FIG. 16A described below are similar to a partial sectional view cut along line A-A of FIG. 1B.

The electronic device of Example 1 or Example 2 described later is a bottom contact-type electronic device, and includes first electrodes 26 and 36 and second electrodes 27 and 37 which are separately formed on a base 10, functional layers 23 and 33 which are made of an organic semiconductor material layer 13, and are formed on the base 10 between the first electrodes 26 and 36 and the second electrodes 27 and 37, functional layer extension portions 24 and 34 which are made of the organic semiconductor material layer 13, and extend from the functional layers 23 and 33, protective films 28 and 38 which are formed at least on the functional layers 23 and 33, and insulating layers 29 and 32 which cover an entire surface. Then, the protective films 28 and 38 are patterned to include at least two sides intersecting with each other at an acute angle, and vertex portions 28A and 38A of the protective films 28 and 38 in which the two sides intersect with each other are chamfered. Furthermore, in the electronic device of Example 1 or Example 2 described later, all vertex portions 28A and 38A of the protective films 28 and 38 in which the sides intersect with each other at an acute angle are chamfered. Specifically, the planar shape of the protective films 28 and 38 is rectangular, and all of the vertex portions (corner portions) 28A and 38A of the protective films 28 and 38 are chamfered. The chamfered portions are in the shape of an arc (a ¼ arc).

In addition, the substrate (a backplane) for configuring an image display apparatus of Example 1 is a substrate in which a plurality of electronic devices of Example 1 or Example 2 to Example 4 described later are arranged in the shape of a 2-dimensional matrix in a first direction and a second direction. Further, the image display apparatus of Example 1 is provided with the substrate for configuring an image display apparatus of Example 1 or Example 2 to Example 4 described later.

Then, in the electronic device of Example 1, as described above, the functional layer extension portion 24 which is made of the organic semiconductor material layer 13 and extends from the functional layer 23, is formed around the functional layer 23, and the outline of the functional layer extension portion 24 is configured to have a closed curve. Specifically, the outline of the functional layer extension portion 24 is rectangular. The functional layer extension portion 24 is formed on a part of the first electrode 26 and the second electrode 27. The protective film 28 covers the functional layer 23 and the functional layer extension portion 24 (refer to FIG. 1B).

Here, the electronic device of Example 1 is a 3-terminal electronic device, the base 10 includes a control electrode 21 which is formed on the substrate for manufacturing an electronic device 11, and an interlayer insulating layer 22 which covers the control electrode 21, and the control electrode 21 faces the functional layer 23 through the interlayer insulating layer 22. Specifically, the electronic device of Example 1 is a bottom contact/bottom gate-type thin film transistor (TFT), the control electrode 21 corresponds to a gate electrode, the interlayer insulating layer 22 corresponds to a gate insulating layer, the first electrode 26 and the second electrode 27 correspond to a source/drain electrode, and the functional layer 23 corresponds to a channel forming region.

Furthermore, in the following description, a term of "gate electrode" may be used instead of the control electrode, and a term of "gate insulating layer" may be used instead of the interlayer insulating layer.

In the substrate (the backplane) for configuring an image display apparatus of Example 1 to Example 4, a plurality of electronic devices (TFT) of Example 1 or Example 2 to Example 4 described later are arranged in the shape of the 2-dimensional matrix in the first direction and in the second direction, the control electrodes 21, 31, 41, and 51 (gate electrodes) of the plurality of electronic devices arranged along the first direction are connected to gate wiring extending along the first direction, and the first electrode 26, 36, 46, and 56 (one source/drain electrode) of the plurality of electronic devices arranged along the second direction are connected to signal wiring extending along the second direction.

Further, the image display apparatus of Example 1 to Example 4 is provided with the substrate (the backplane) for configuring an image display apparatus of Example 1.

Here, in Example 1 or Example 2 to Example 4 described later, the base 10 is configured by, for example, a substrate for manufacturing an electronic device 11 is made of a glass substrate, and an insulating film 12 is made of $SiO_2$ which is formed on a surface of the substrate for manufacturing an electronic device 11. In Example 1 or Example 3 described later, the base 10 is further configured by, the control electrodes (the gate electrodes) 21 and 41, and the interlayer insulating layers (the gate insulating layers) 22 and 42. The control electrodes (the gate electrodes) 21, 31, 41 and 51 are formed of, for example, aluminum (Al) or a laminated structure of, Al, and Ti. The organic semiconductor material layer 13 for configuring the functional layers 23, 33, 43, and 53, the functional layer extension portions 24, 34, 44, and 54, and inactive regions 25, 35, 45, and 55 is made of, for example, pentacene, TIPS-pentacene, or a derivative of perixanthenoxanthene (PXX) (more specifically, for example, ethylphenyl-PXX). The first electrodes 26, 36, 46, and 56 and the second electrodes 27, 37, 47, and 57 (a pair of source/drain electrodes) are made of, for example, gold (Au) or copper (Cu). The protective films 28, 38, 48, and 58 are made of a fluorine-based resin.

In addition, in Example 1 or Example 3 described later, the gate insulating layer 22 is made of, for example, polyvinylphenol (PVP). In addition, the insulating layer (a passivation film) 29 is made of a fluorine-containing ether polymer.

As illustrated in FIG. 1B, FIG. 2B, FIG. 3B, and FIG. 4B, it is preferable that a distance $L_0$ from an end surface of the first electrode 26 which faces the second electrode 27 to an edge portion of the protective film 28, and a distance $L_0$ from an end surface of the second electrode 27 which faces the first electrode 26 to the edge portion of the protective film 28 along a channel length be, for example, more than or equal to 1 μm, and specifically, for example, be 10 μm in Example 1 or Example 2 to Example 4 described later.

Figure 17A:
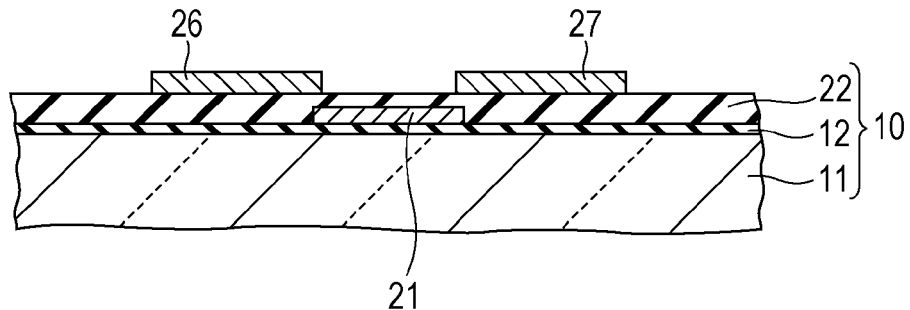
FIG. 17A, FIG. 17B, and FIG. 17C are schematic partial sectional views of a base or the like for describing an electronic device manufacturing method according to Example 1.
Figure 17B:
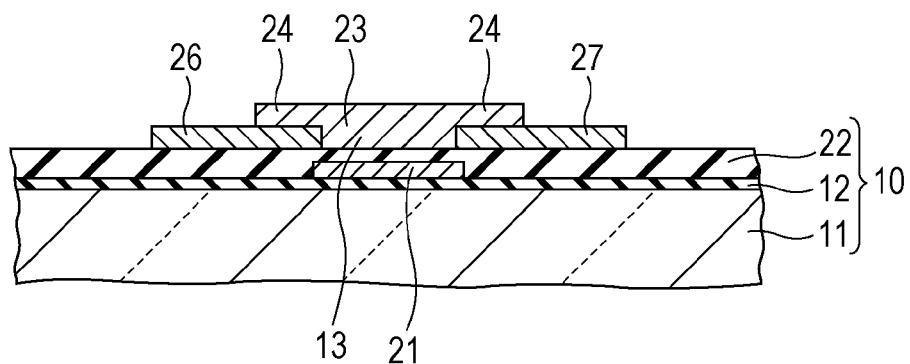
Figure 17C:
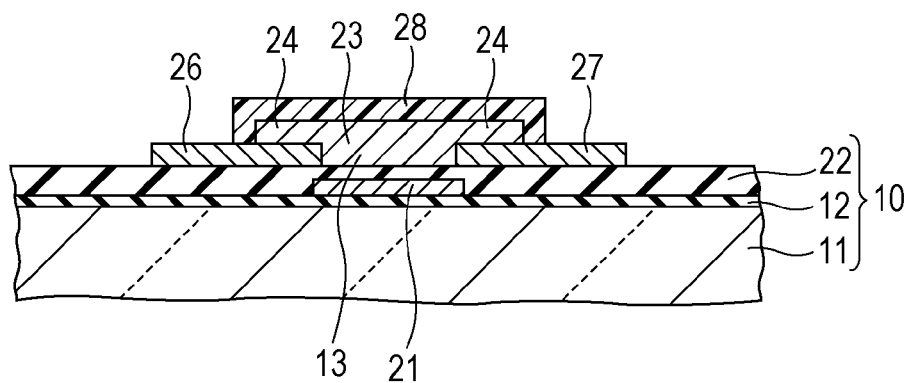

Hereinafter, a manufacturing method of the electronic device of Example 1 will be described with reference to a schematic partial sectional view of the base or the like of FIG. 17A, FIG. 17B, and FIG. 17C. Furthermore, the schematic partial sectional view is similar to a partial sectional view cut along line A-A of FIG. 1B.

Process-100

First, the gate electrode 21 is formed on the substrate for manufacturing an electronic device 11. Specifically, in a state where a part of the insulating film 12 formed on the substrate for manufacturing an electronic device 11 is covered by a pad mask, the gate electrode 21 is formed by a vacuum evaporation method. Thus, the gate electrode 21 may be formed without performing a photolithography process. However, the forming method of the gate electrode 21 is not limited thereto, and the gate electrode 21 may be formed on the basis of a combination of a film forming technology of a conductive material layer for configuring the gate electrode 21 and an etching technology, may be formed on the basis of a so-called lift off method, and may be formed on the basis of a printing method.

Process-110

Next, the gate insulating layer 22 is formed on the insulating film 12 and the gate electrode 21. Specifically, the gate insulating layer 22 is formed on the entire surface on the basis of a spin coat method. More specifically, polyvinylphenol (PVP) solution including propylene glycol monomethylether acetate (PGMEA) and a cross-linking agent is applied on the insulating film 12 and the control electrode 21, then heated to 150° C., and thus the gate insulating layer 22 made of polyvinylphenol is able to be obtained. Thus, the base 10 made of the control electrode 21 formed on the substrate for manufacturing an electronic device 11, and the interlayer insulating layer 22 which covers the control electrode 21 is able to be obtained.

Process-120

Subsequently, the first electrode 26 and the second electrode 27 (a pair of source/drain electrodes) are formed on the base 10. That is, the first electrode 26 and the second electrode 27 are able to be formed on the basis of the combination of the film forming technology of the conductive material layer for configuring the first electrode 26 and the second electrode 27 and the etching technology. However, the forming method of the first electrode 26 and the second electrode 27 is not limited thereto, and in the state where a region other than the region for forming the first electrode 26 and the second electrode 27 is covered by the pad mask, the first electrode 26 and the second electrode 27 may be formed by the vacuum evaporation method, may be formed on the basis of the so-called lift off method, and may be formed on the basis of the printing method. Thus, a structure illustrated in FIG. 17A is able to be obtained.

Process-130

Next, the functional layer 23 and the functional layer extension portion 24 which are made of the organic semiconductor material layer 13 are formed. Specifically, the organic semiconductor material layer 13 is formed on the gate insulating layer 22, and the first electrode 26, and the second electrode 27, for example, on the basis of the spin coat method. In the spin coat method, the organic semiconductor material solution in which the organic semiconductor material is dissolved in the solvent, specifically, the organic semiconductor material solution in which ethylphenyl-PXX is dissolved in toluene is used.

Next, the organic semiconductor material layer 13 is patterned. Specifically, the organic semiconductor material layer 13 is patterned by a laser ablation method. More specifically, laser light of wavelength 248 nm emitted from a KrF excimer laser is applied to a desired region of the organic semiconductor material layer 13, an unnecessary region of the organic semiconductor material layer 13 is removed, and the organic semiconductor material layer 13 is patterned. Thus, the functional layer 23 and the functional layer extension portion 24 illustrated in FIG. 17B are able to be obtained.

Process-140

Subsequently, the protective film 28 for covering the functional layer 23 and the functional layer extension portion 24 is formed. Specifically, the protective film of fluorine-based resin is formed on the entire surface on the basis of the spin coat method, and the protective film is patterned on the basis of a photolithography technology and a dry etching technology, and thus the protective film 28 having a rectangular planar shape in which 4 vertex portions (corner portions) 28A are chamfered, is able to be obtained (refer to FIG. 17C, and FIG. 1B).

Process-150

Next, the insulating layer (the passivation film) 29 is formed on the entire surface on the basis of the spin coat method. Thus, the electronic device (the bottom contact/bottom gate-type thin film transistor) of Example 1 of the structure illustrated in FIG. 1A is able to be obtained. Alternatively, the substrate for configuring an image display apparatus and the image display apparatus which are provided with the electronic device (TFT) of Example 1 are able to be obtained.

However, at the time of forming the insulating layer (the passivation film) 29, generally, the solution (hereinafter, for the sake of simplicity, referred to as "solution for insulating layer") for forming the insulating layer 29 is dropped on the center of the substrate for manufacturing an electronic device 11, and the substrate for manufacturing an electronic device 11 is rotated. At this time, the solution for insulating layer spreads from the center of the substrate for manufacturing an electronic device 11 toward a circumferential portion. When the vertex portion (the corner portion) 28A of the protective film 28 is not chamfered, the solution for insulating layer penetrates between the vertex portion 28A of the protective film 28 and a foundation (for example, the gate insulating layer 22), and the protective film 28 may be peeled off from the foundation. However, since the vertex portion 28A of the protective film 28 is chamfered, it is possible to reliably prevent the solution for insulating layer from penetrating between the vertex portion 28A of the protective film 28 and the foundation, the protective film 28 is not peeled off from the foundation, and thus the electronic device having high reliability is able to be obtained.

Process-160

For example, in the manufacture of the image display apparatus, in succession to this process, an image display unit (specifically, for example, an image display unit including an organic electroluminescence element or an electrophoresis display element, a semiconductor light-emitting element, or the like) is formed on the TFT or on an upper portion of the TFT which is the electronic device for configuring a control unit (a pixel driving circuit) of the image display apparatus, obtained therefor, on the basis of an existing method, and thus the image display apparatus is able to be manufactured. Here, the electronic device for configuring the control unit (the pixel driving circuit) of the image display apparatus, obtained therefor, and an electrode (for example, a pixel electrode) of the image display unit may be connected by, for example, a connection portion such as a contact hole or wiring. The same is applied to the following Example 2 to Example 4.

In the electronic device of Example 1, the protective film is patterned to include at least two sides which intersect with each other at an acute angle, and the vertex portion of the protective film in which the two sides intersect with each other, is chamfered, and thus the protective film is not peeled off from the functional layer or the functional layer extension portion at the time of forming the insulating layer (the passivation film), and it is possible to reliably protect the functional layer. Furthermore, since the protective film is patterned, high adhesiveness is able to be secured between the insulating layer for covering the entire surface of the electronic device, and the first electrode, the second electrode, and the gate insulating layer, and the problem in which the insulating layer (the passivation film) is peeled off, is not generated. In addition, in order to improve adhesiveness between a top surface of the protective film and the insulating layer (the passivation film), it is not necessary to perform various processes (for example, a process for surface hydrophilicity) with respect to the top surface of the protective film, it is possible to promote simplification of the electronic device manufacturing process, and it is possible to prevent the functional layer from being damaged. Furthermore, only a part of a plurality of vertex portions may be chamfered, and in this case, it is preferable that the vertex portion on a side which is close to the center of the substrate (or the backplane) for manufacturing an electronic device be chamfered in each electronic device.

Figure 2A:
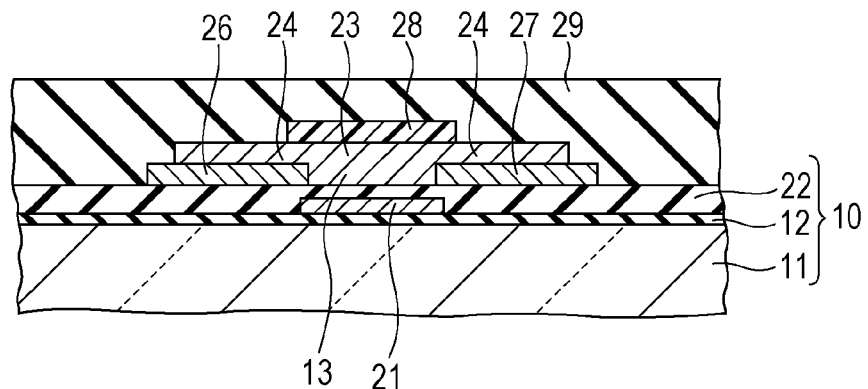
Figure 2B:
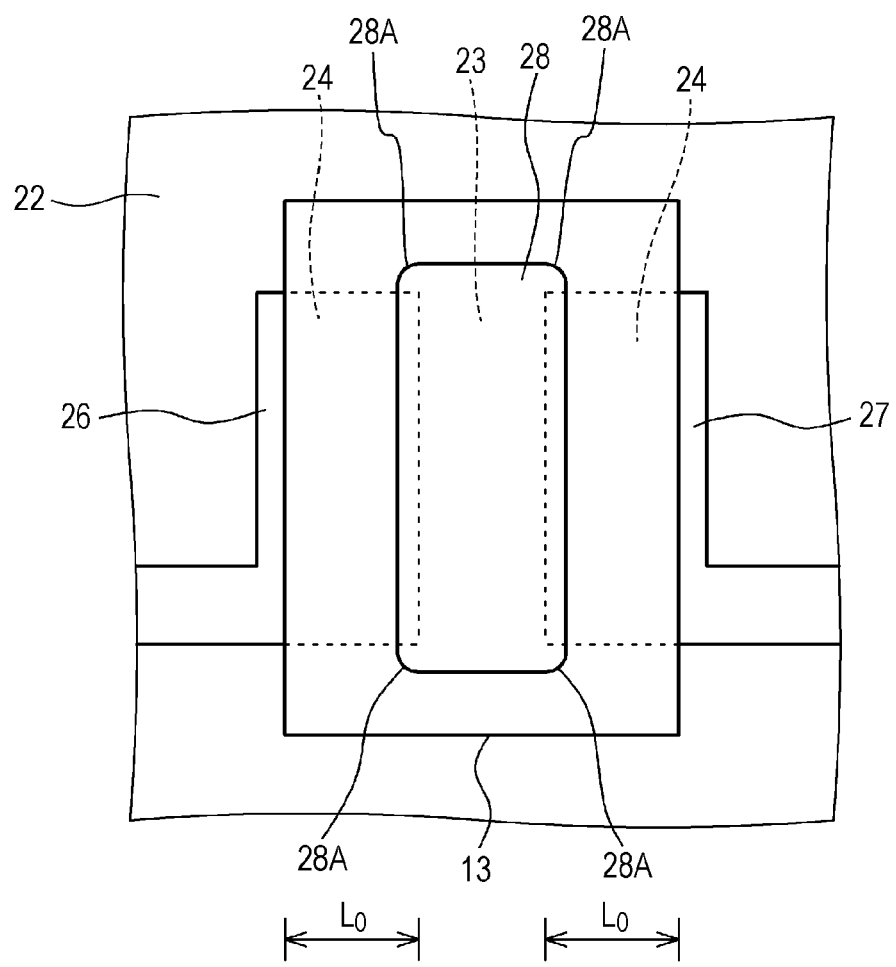

A schematic partial sectional view of a modification example of the electronic device of Example 1 is illustrated in FIG. 2A, and a schematic view which illustrates an arrangement of the functional layer or the like is illustrated in FIG. 2B. In the modification example, the protective film 28 is formed on a part of the functional layer extension portion 24 and on the functional layer 23. Furthermore, the protective film 28 may be formed on the functional layer 23.

Figure 3A:
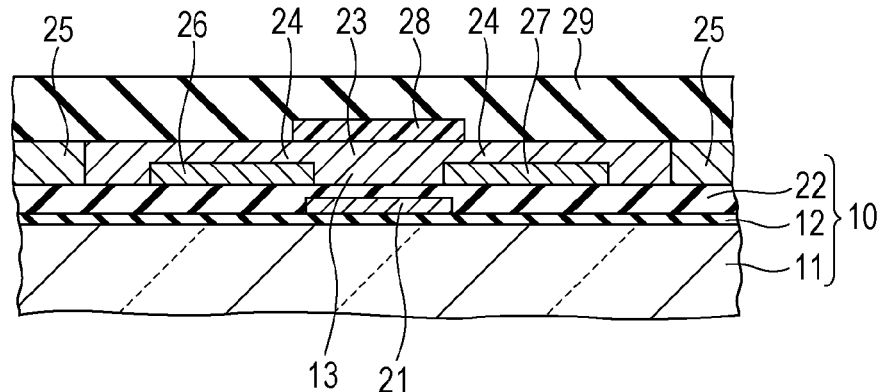
Figure 3B:
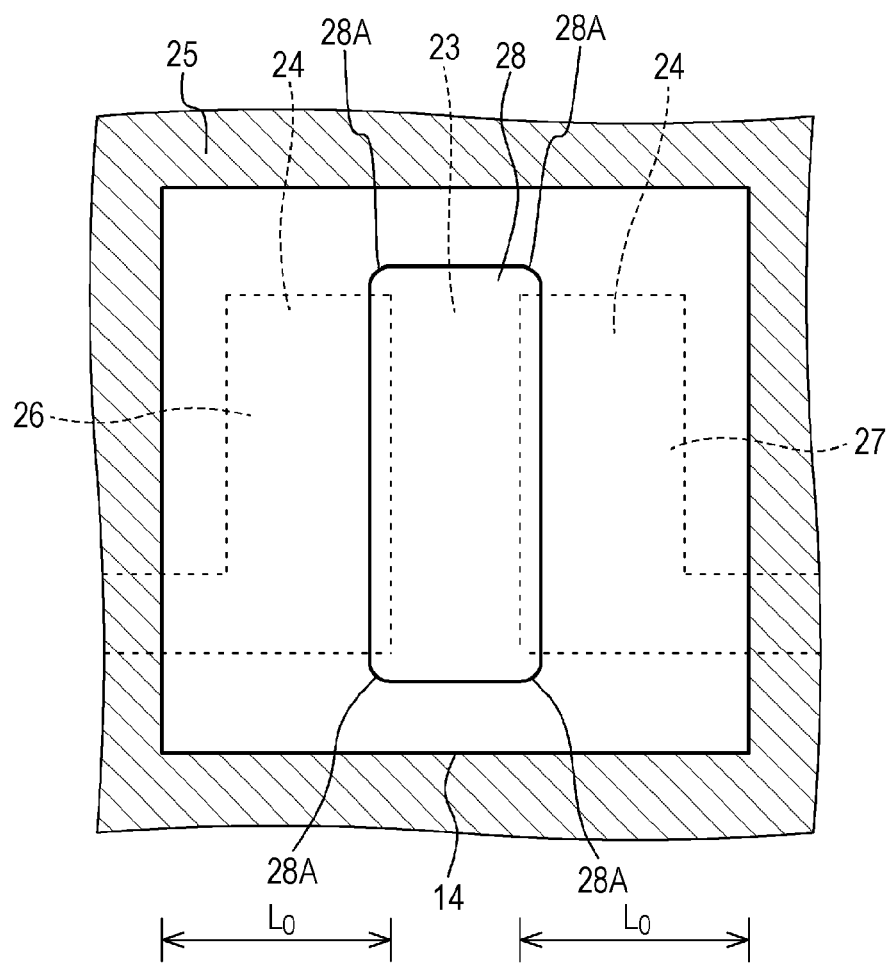
Figure 4A:
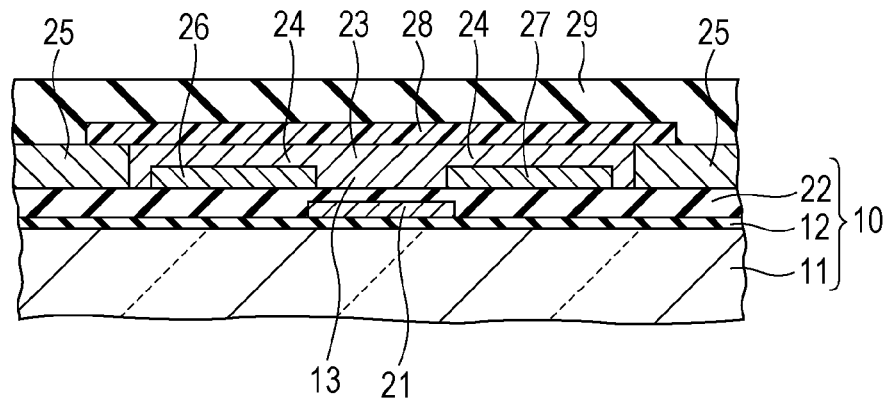
Figure 4B:
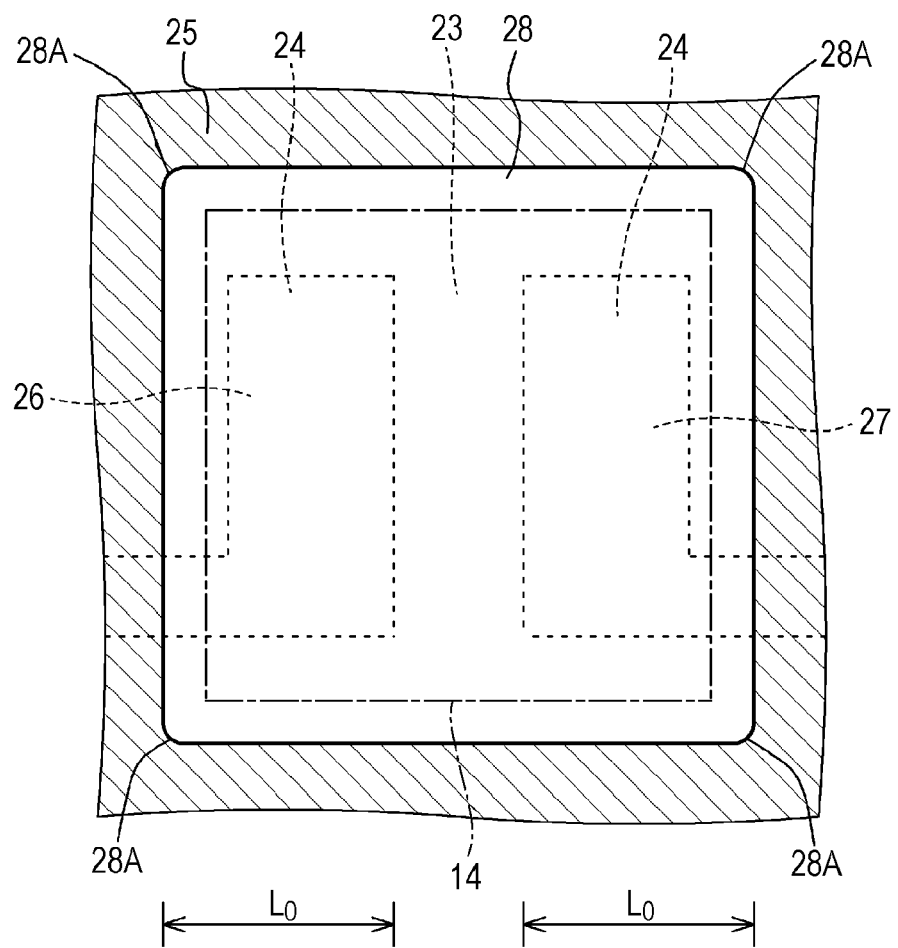

Alternatively, a schematic partial sectional view of the modification example of the electronic device of Example 1 is illustrated in FIG. 3A, and FIG. 4A, and a schematic view which illustrates an arrangement of the functional layer or the like is illustrated in FIG. 3B, and FIG. 4B. In the modification example, the inactive region 25 made of the organic semiconductor material layer 13, in which an inactive process is performed, extends from the functional layer extension portion 24. In FIG. 3B and FIG. 4B, in order to specify the inactive region 25, diagonal lines are applied to the inactive region 25. Here, in an example illustrated in FIG. 3A and FIG. 3B, the protective film 28 is formed on a part of the functional layer extension portion 24 and on the functional layer 23, and in an example illustrated in FIG. 4A and FIG. 4B, the protective film 28 covers the functional layer 23 and the functional layer extension portion 24. Furthermore, the protective film 28 may be formed on the functional layer 23. The inactive region 25 is able to be obtained by laser irradiation in which irradiation conditions are optimized. The same is applied to the following embodiments. Furthermore, in FIG. 3B, FIG. 7B, FIG. 11B, and FIG. 15B, a boundary indicated by a solid line 14 is a boundary between the functional layer extension portion 24 and the inactive region 25, and in FIG. 4B, FIG. 8B, FIG. 12B, and FIG. 16B, a boundary indicated by a dashed-dot line 14 is a boundary between the functional layer extension portion 24 and the inactive region 25.

EXAMPLE 2

Figure 5A:
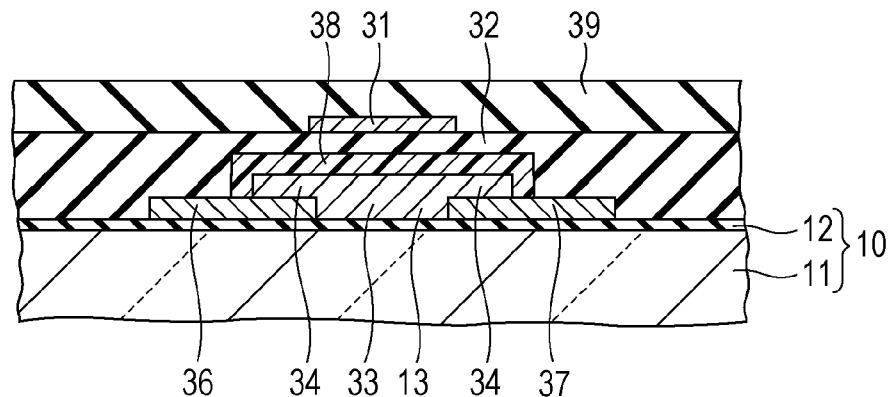
Figure 5B:
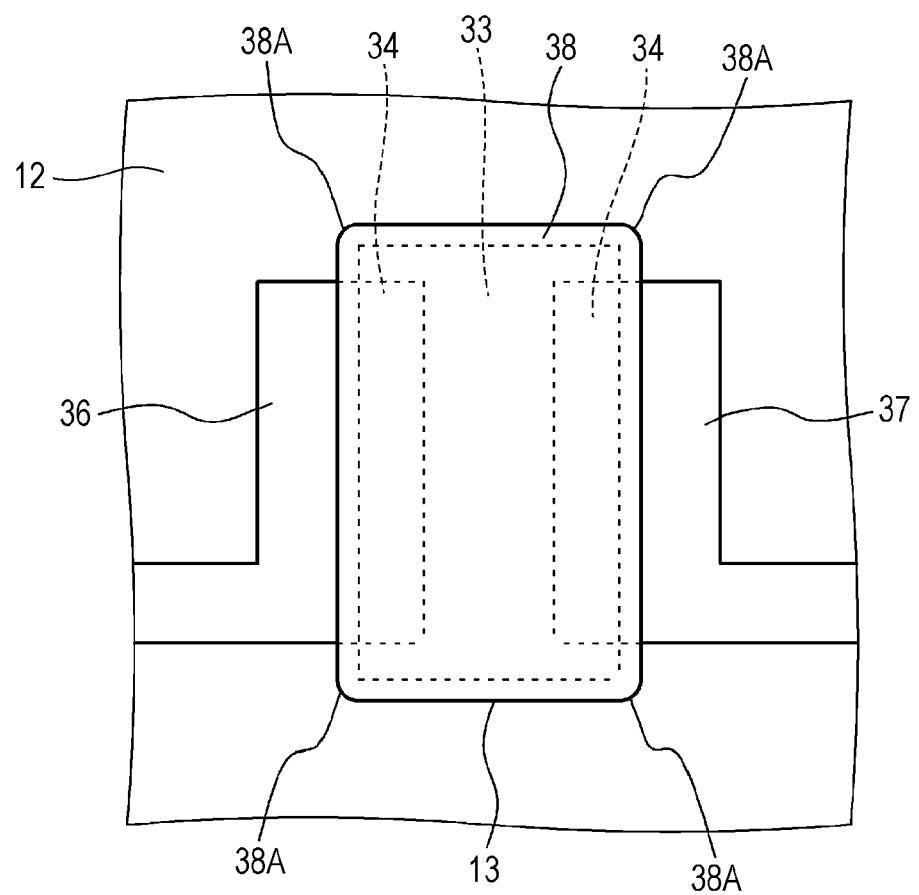

Example 2 has a configuration modified from Example 1, and relates to a bottom contact/top gate-type electronic device. A schematic partial sectional view of the electronic device of Example 2 which is similarly cut along line A-A of FIG. 1B is illustrated in FIG. 5A, and a schematic view which illustrates an arrangement of the functional layer or the like is illustrated in FIG. 5B, and in the electronic device of Example 2, a control electrode 31 which faces the functional layer 33 through the insulating layer 32 is further included. Specifically, the electronic device of Example 2 is the bottom contact/top gate-type thin film transistor (TFT), the control electrode 31 corresponds to the gate electrode, the insulating layer 32 corresponds to the gate insulating layer, the first electrode 36 and the second electrode 37 correspond to the source/drain electrode, and the functional layer 33 corresponds to the channel forming region.

Then, in the electronic device of Example 2, as described above, the functional layer extension portion 34 which is made of the organic semiconductor material layer 13 and extends from the functional layer 33, is formed around the functional layer 33, and the outline of the functional layer extension portion 34 is configured to have the closed curve. Specifically, the outline of the functional layer extension portion 34 is rectangular. The functional layer extension portion 34 is formed on a part of the first electrode 36 and the second electrode 37. The protective film 38 covers the functional layer 33 and the functional layer extension portion 34 (refer to FIG. 5B).

In Example 2 or Example 4 described later, the insulating layer (the gate insulating layer) 32 is made of, for example, polyvinylphenol (PVP). In addition, the passivation film 38 is made of a fluorine-containing ether polymer.

Figure 18A:
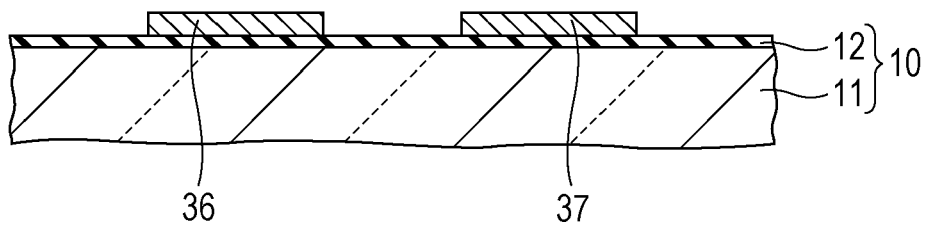
FIG. 18A, FIG. 18B, and FIG. 18C are schematic partial sectional views of a base or the like for describing an electronic device manufacturing method according to Example 2.
Figure 18B:
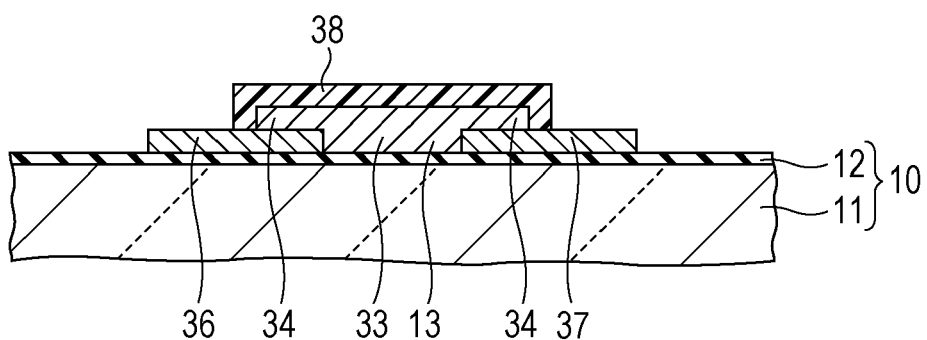
Figure 18C:
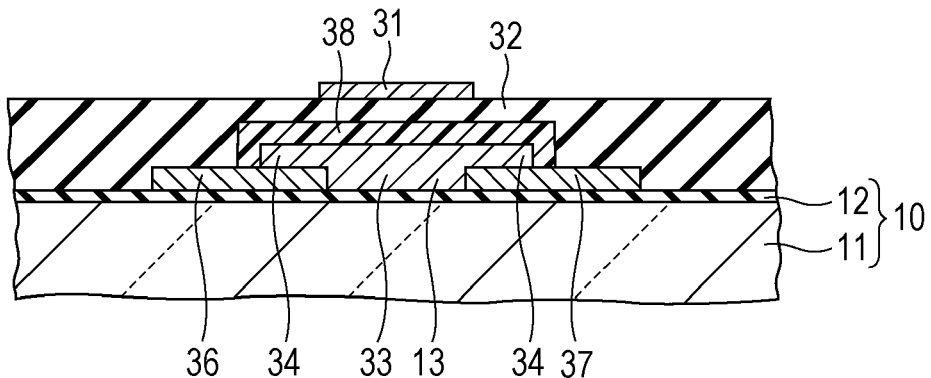

Hereinafter, a manufacturing method of the electronic device of Example 2 will be described with reference to a schematic partial sectional view of the base or the like of FIG. 18A, FIG. 18B, and FIG. 18C. Furthermore, the schematic partial sectional view is similar to a partial sectional view cut along line A-A of FIG. 1B.

Process-200

First, similar to Process-120 of Example 1, the first electrode 36 and the second electrode 37 (a pair of source/drain electrodes) are formed on the insulating film 12 formed on the substrate for manufacturing an electronic device 11. Thus, a structure illustrated in FIG. 18A is able to be obtained.

Process-210

Next, similar to Process-130 of Example 1, the functional layer 33 and the functional layer extension portion 34 which are made of the organic semiconductor material layer 13 are formed on the first electrode 36, the second electrode 37, and the insulating film 12.

Process-220

Subsequently, similar to Process-140 of Example 1, the protective film 38 for covering the functional layer 33 and the functional layer extension portion 34 is formed. Thus, a structure illustrated in FIG. 18B is able to be obtained.

Process-230

Next, similar to Process-110 of Example 1, the insulating layer (the gate insulating layer) 32 is formed on the protective film 38, the first electrode 36, the second electrode 37, and the insulating film 12. Thus, a structure illustrated in FIG. 18C is able to be obtained.

However, at the time of forming the insulating layer 32, generally, the solution (the solution for insulating layer) for forming the insulating layer 32 is dropped on the center of the substrate for manufacturing an electronic device 11, and the substrate for manufacturing an electronic device 11 is rotated. At this time, the solution for insulating layer spreads from the center of the substrate for manufacturing an electronic device 11 toward the circumferential portion. When the vertex portion (the corner portion) 38A of the protective film 38 is not chamfered, the solution for insulating layer penetrates between the vertex portion 38A of the protective film 38 and the foundation (for example, the insulating film 12), and the protective film 38 may be peeled off from the foundation. However, since the vertex portion 38A of the protective film 38 is chamfered, it is possible to reliably prevent the solution for insulating layer from penetrating between the vertex portion 38A of the protective film 38 and the foundation, the protective film 38 is not peeled off from the foundation, and thus the electronic device having high reliability is able to be obtained.

Process-240

Subsequently, similar to Process-100 of Example 1, the gate electrode 31 is formed on the insulating layer (the gate insulating layer) 32.

Process-250

Next, the passivation film 38 is formed on the entire surface on the basis of the spin coat method. Thus, the electronic device (the bottom contact/top gate-type thin film transistor) of Example 2 of the structure illustrated in FIG. 5A is able to be obtained. Alternatively, the substrate for configuring an image display apparatus and the image display apparatus which are provided with the electronic device (TFT) of Example 2 are able to be obtained.

Process-260

For example, in the manufacture of the image display apparatus, similar to Process-160 of Example 1, the image display apparatus is further able to be manufactured.

Figure 6A:
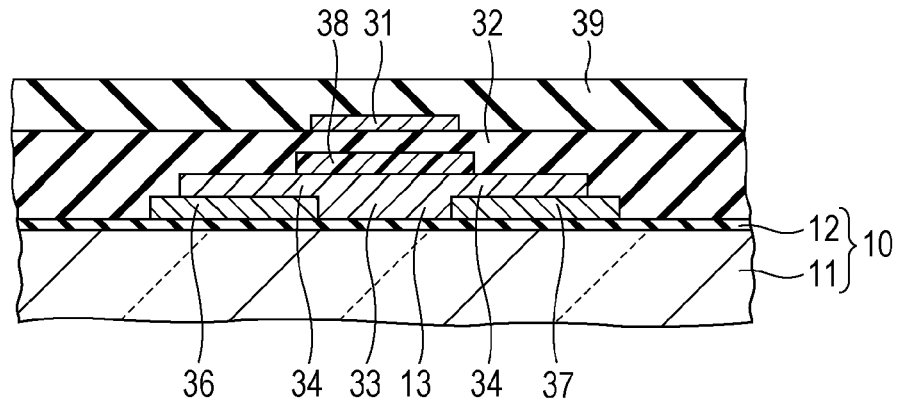
Figure 6B:
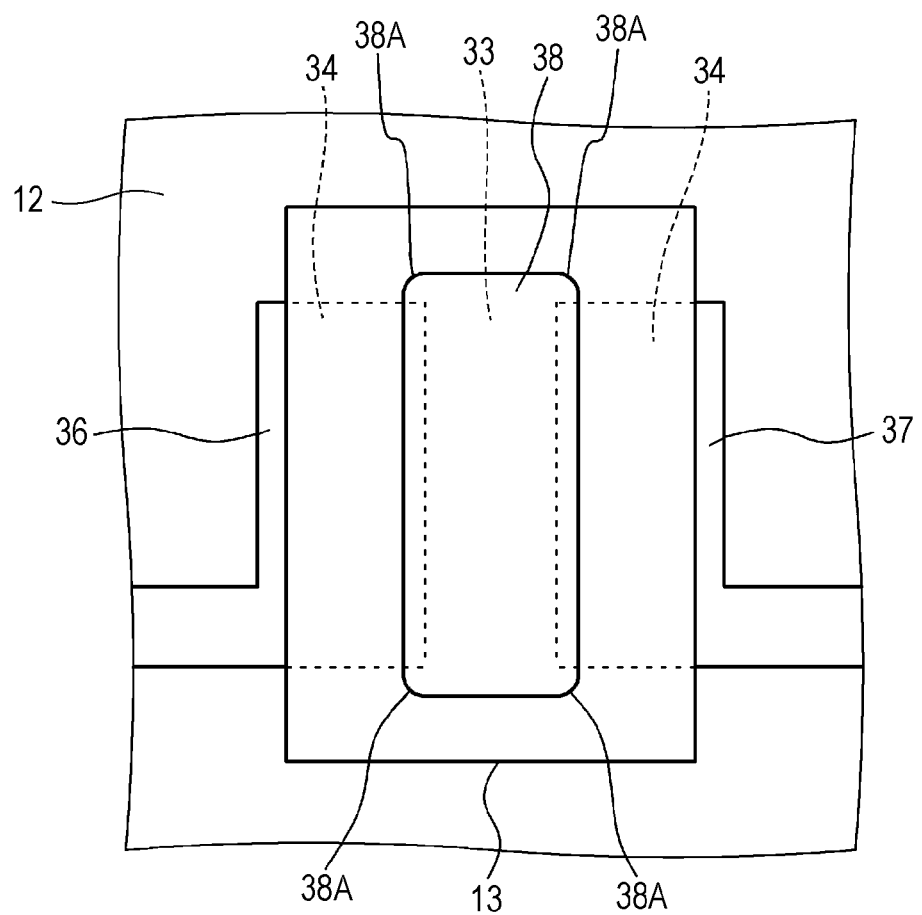

A schematic partial sectional view of a modification example of the electronic device of Example 2 is illustrated in FIG. 6A, and a schematic view which illustrates an arrangement of the functional layer or the like is illustrated in FIG. 6B. In the modification example, the protective film 38 is formed on a part of the functional layer extension portion 34 and on the functional layer 33. Furthermore, the protective film 38 may be formed on the functional layer 33.

Figure 7A:
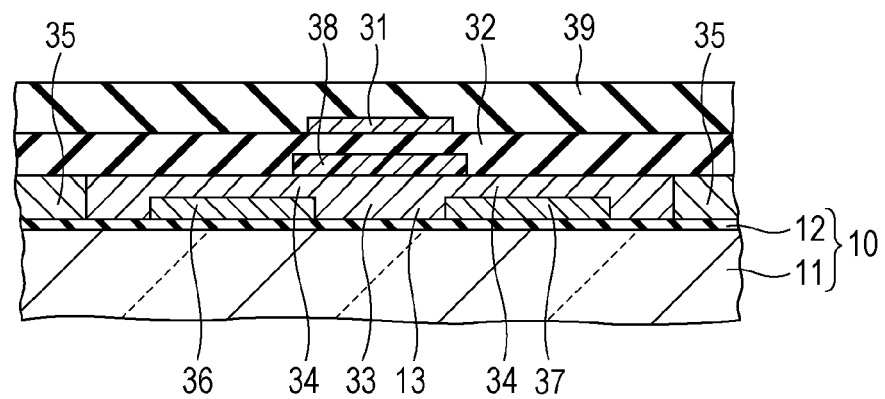
Figure 7B:
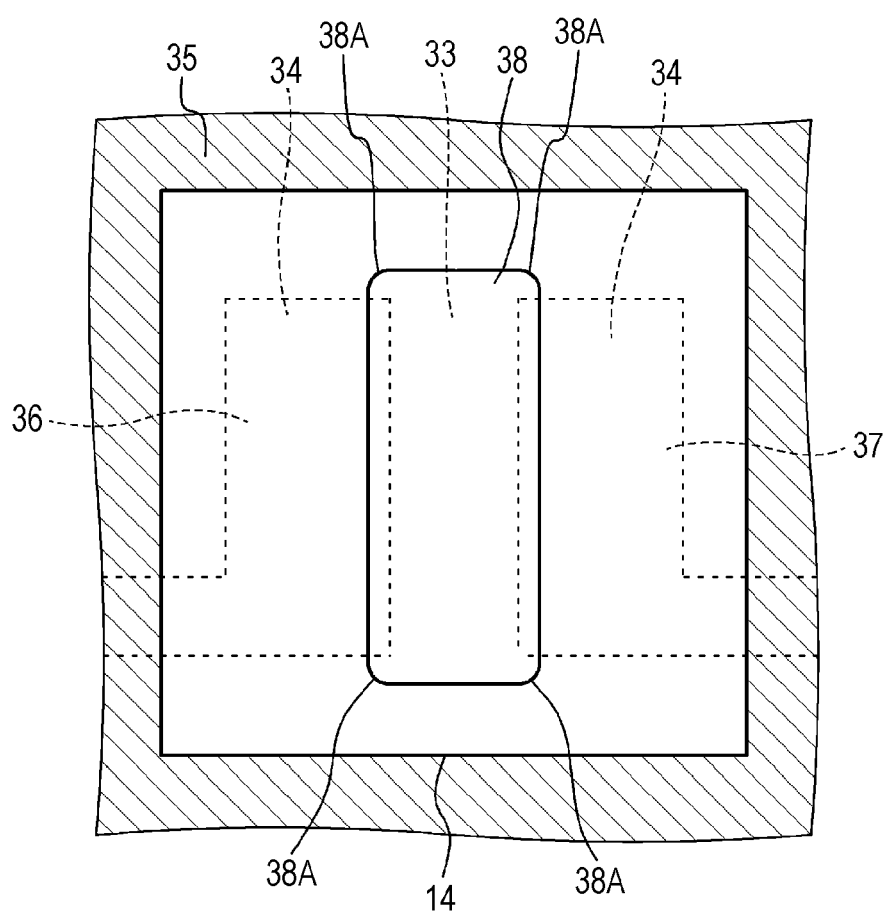
Figure 8A:
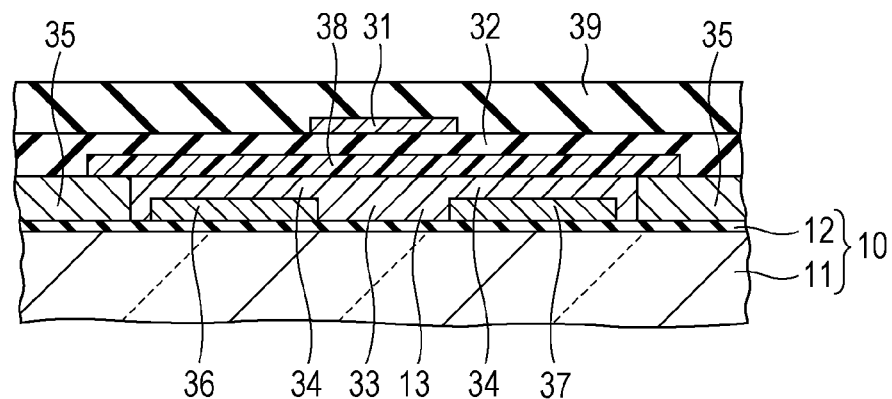
Figure 8B:
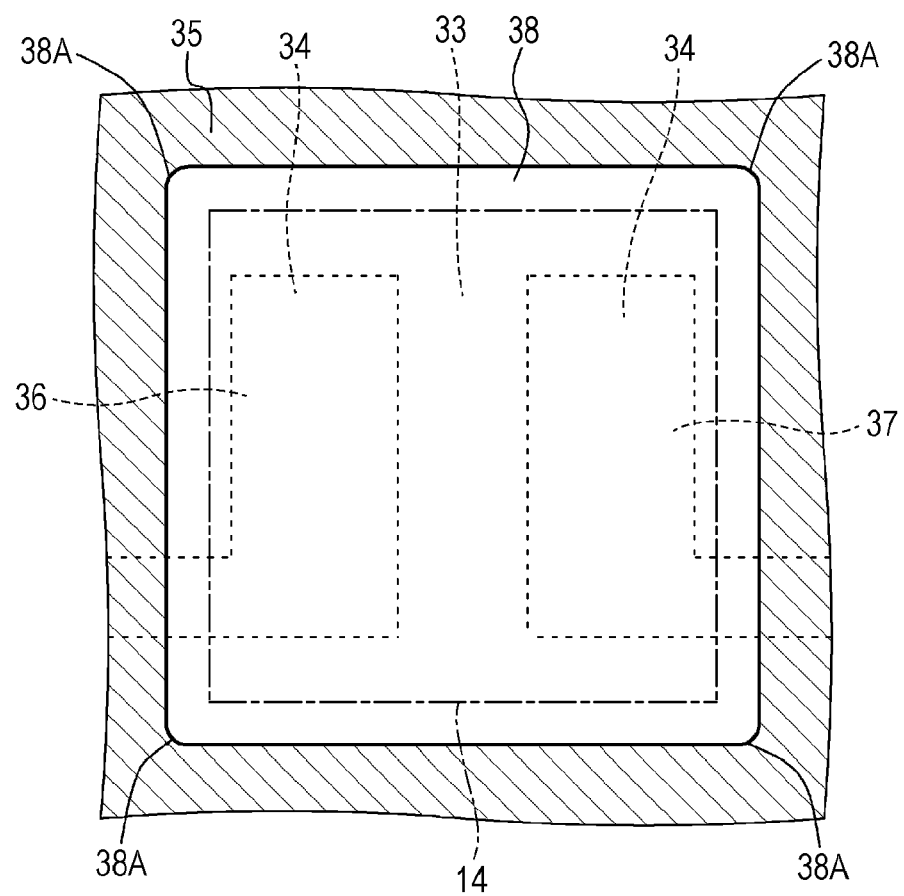

Alternatively, a schematic partial sectional view of the modification example of the electronic device of Example 2 is illustrated in FIG. 7A, and FIG. 8A, and a schematic view which illustrates an arrangement of the functional layer or the like is illustrated in FIG. 7B, and FIG. 8B. In the modification example, the inactive region 35 is made of the organic semiconductor material layer 13, in which the inactive process is performed, extends from the functional layer extension portion 34. In FIG. 7B and FIG. 8B, in order to specify the inactive region 35, diagonal lines are applied to the inactive region 35. Here, in an example illustrated in FIG. 7A and FIG. 7B, the protective film 38 is formed on a part of the functional layer extension portion 34 and on the functional layer 33, and in an example illustrated in FIG. 8A and FIG. 8B, the protective film 38 covers the functional layer 33 and the functional layer extension portion 34. Furthermore, the protective film 38 may be formed on the functional layer 33.

EXAMPLE 3

Figure 9A:
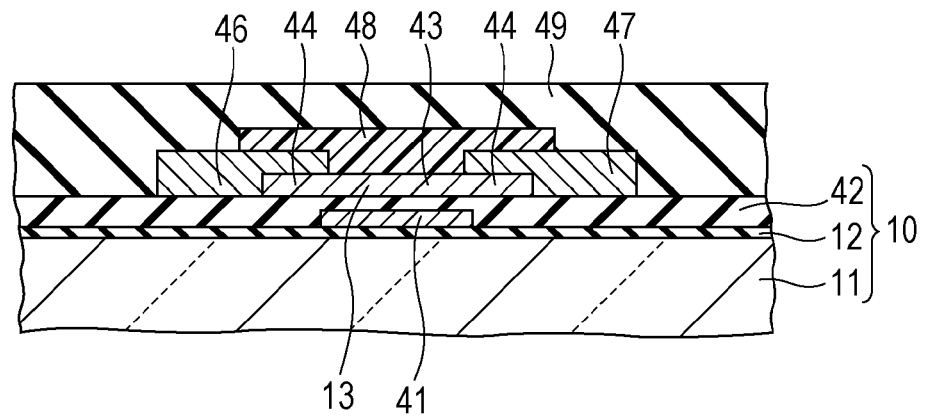
Figure 9B:
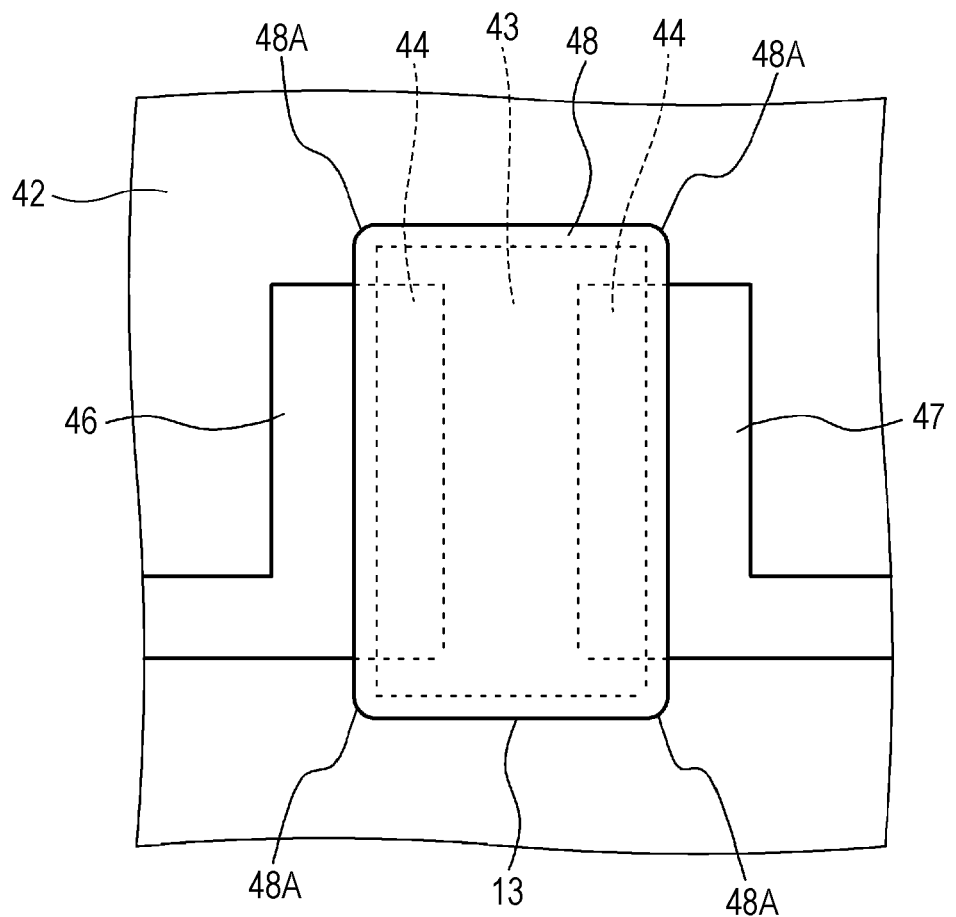

Example 3 relates to the electronic device according to the second embodiment of the present disclosure, specifically, to a top contact/bottom gate-type electronic device (more specifically, the thin film transistor (TFT) which is the semiconductor device), to the substrate for configuring an image display apparatus of the present disclosure, and to the image display apparatus of the present disclosure. A schematic partial sectional view of the electronic device of Example 3 is illustrated in FIG. 9A, and a schematic view which illustrates an arrangement of the functional layer or the like is illustrated in FIG. 9B.

The electronic device of Example 3 or Example 4 described later, is the top contact-type electronic device, and includes the functional layers 43 and 53 which are made of the organic semiconductor material layer 13, and are formed on the base 10, the functional layer extension portions 44 and 54 which are made of the organic semiconductor material layer 13, and extend from the functional layers 43 and 53, the first electrodes 46 and 56 and the second electrodes 47 and 57 which are separately formed on the functional layer extension portions 44 and 54 and interpose the functional layers 43 and 53 therebetween, the protective films 48 and 58 which are formed at least on the functional layers 43 and 53, and the insulating layers 49 and 52 which cover the entire surface. Then, the protective films 48 and 58 are patterned to include at least two sides which intersect with each other at an acute angle, and vertex portions 48A and 58A of the protective films 48 and 58 in which the two sides intersect with each other, are chamfered. Furthermore, in the electronic device of Example 3 or Example 4 described later, all of the vertex portions 48A and 58A of the protective films 48 and 58 in which the sides intersect with each other at an acute angle are chamfered. Specifically, the planar shape of the protective films 48 and 58 is rectangular, and all of the vertex portions (corner portions) 48A and 58A of the protective films 48 and 58 are chamfered. The chamfered portions are in the shape of an arc (a ¼ arc).

Then, in the electronic device of Example 3, the outline of the functional layer extension portion 44 is configured to have the closed curve. Specifically, the outline of the functional layer extension portion 44 is rectangular. The functional layer extension portion 44 is formed on a part of the first electrode 46 and the second electrode 47. The protective film 48 covers the functional layer 43 and the functional layer extension portion 44 (refer to FIG. 9B).

Here, the electronic device of Example 3, is the 3-terminal electronic device, the base 10 includes a control electrode 41 formed on the substrate for manufacturing an electronic device 11, and the interlayer insulating layer 42 for covering the control electrode 41, and the control electrode 41 faces the functional layer 43 through the interlayer insulating layer 42. Specifically, the electronic device of Example 3 is the top contact/bottom gate-type thin film transistor (TFT), the control electrode 41 corresponds to the gate electrode, the interlayer insulating layer 42 corresponds to the gate insulating layer, the first electrode 46 and the second electrode 47 correspond to the source/drain electrode, and the functional layer 43 corresponds to the channel forming region.

Figure 19A:
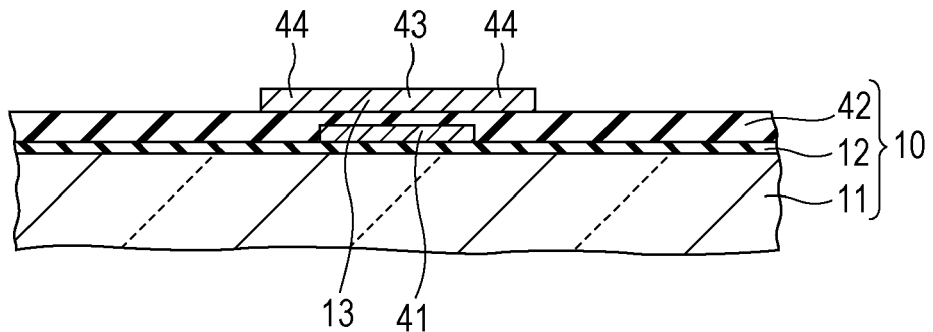
FIG. 19A, FIG. 19B, and FIG. 19C are schematic partial sectional views of a base or the like for describing an electronic device manufacturing method according to Example 3.

Hereinafter, a manufacturing method of the electronic device of Example 3 will be described with reference to a schematic partial sectional view of the base or the like of FIG. 19A, FIG. 19B, and FIG. 19C. Furthermore, the schematic partial sectional view is similar to a partial sectional view cut along line A-A of FIG. 1B.

Process-300

First, similar to Process-100 and Process-110 of Example 1, the gate electrode 41 is formed on the insulating film 12 formed on the substrate for manufacturing an electronic device 11, and the gate insulating layer 42 is further formed on the insulating film 12 and the gate electrode 41.

Process-310

Subsequently, similar to Process-130 of Example 1, the functional layer 43 and the functional layer extension portion 44 which are made of the organic semiconductor material layer 13 are formed on the gate insulating layer 42 (refer to FIG. 19A).

Process-320

Figure 19B:
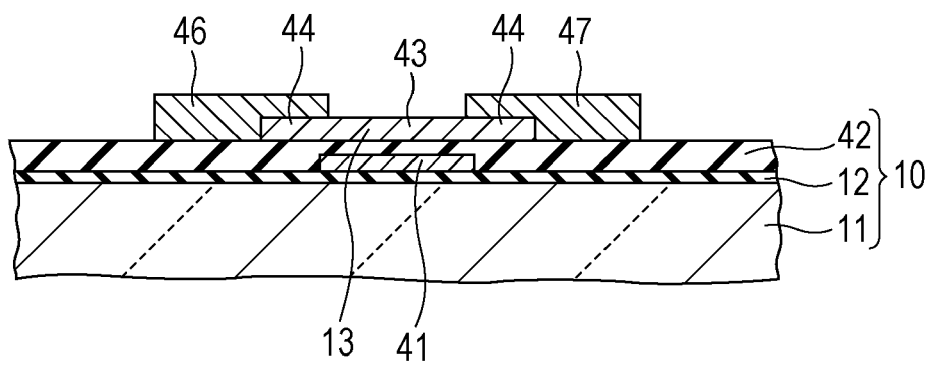
Figure 19C:
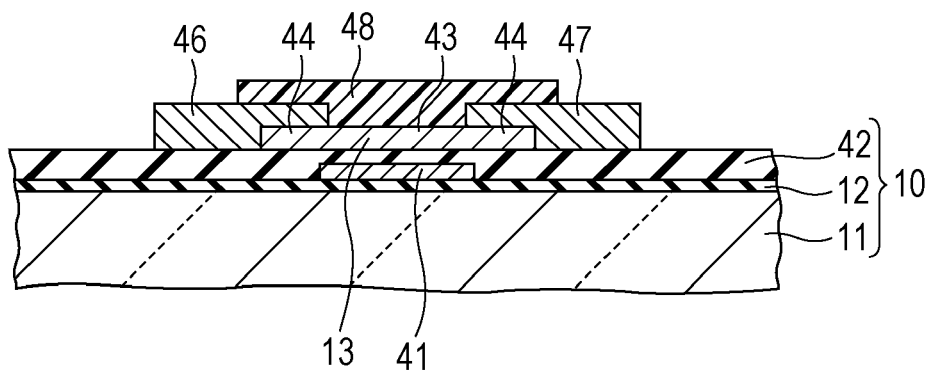

Next, similar to Process-120 of Example 1, the first electrode 46, and the second electrode 47 are formed on the functional layer 43 and the gate insulating layer 42 (refer to FIG. 19B).

Process-330

Subsequently, similar to Process-140 of Example 1, the protective film 48 for covering the functional layer 43 and the functional layer extension portion 44 is formed. Thus, a structure illustrated in FIG. 19C is able to be obtained.

Process-340

Next, the insulating layer (the passivation film) 49 is formed on the entire surface on the basis of the spin coat method. Thus, the electronic device (the top contact/bottom gate-type thin film transistor) of Example 3 of the structure illustrated in FIG. 9A is able to be obtained. Alternatively, the substrate for configuring an image display apparatus and the image display apparatus which are provided with the electronic device (TFT) of Example 3 are able to be obtained.

However, at the time of forming the insulating layer (the passivation film) 49, generally, the solution (referred to as "solution for insulating layer") for forming the insulating layer 49 is dropped on the center of the substrate for manufacturing an electronic device 11, and the substrate for manufacturing an electronic device 11 is rotated. At this time, the solution for insulating layer spreads from the center of the substrate for manufacturing an electronic device 11 toward the circumferential portion. When the vertex portion (the corner portion) 48A of the protective film 48 is not chamfered, the solution for insulating layer penetrates between the vertex portion 48A of the protective film 48 and the foundation (for example, the gate insulating layer 42), and the protective film 48 may be peeled off from the foundation. However, since the vertex portion 48A of the protective film 48 is chamfered, it is possible to reliably prevent the solution for insulating layer from penetrating between the vertex portion 48A of the protective film 48 and the foundation, the protective film 48 is not peeled off from the foundation, and thus the electronic device having high reliability is able to be obtained.

Process-350

For example, in the manufacture of the image display apparatus, similar to Process-160 of Example 1, the image display apparatus is further able to be manufactured.

Figure 10A:
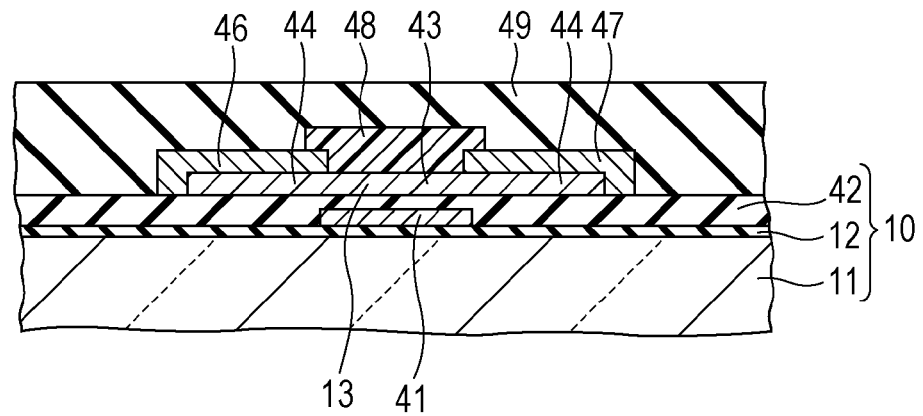
Figure 10B:
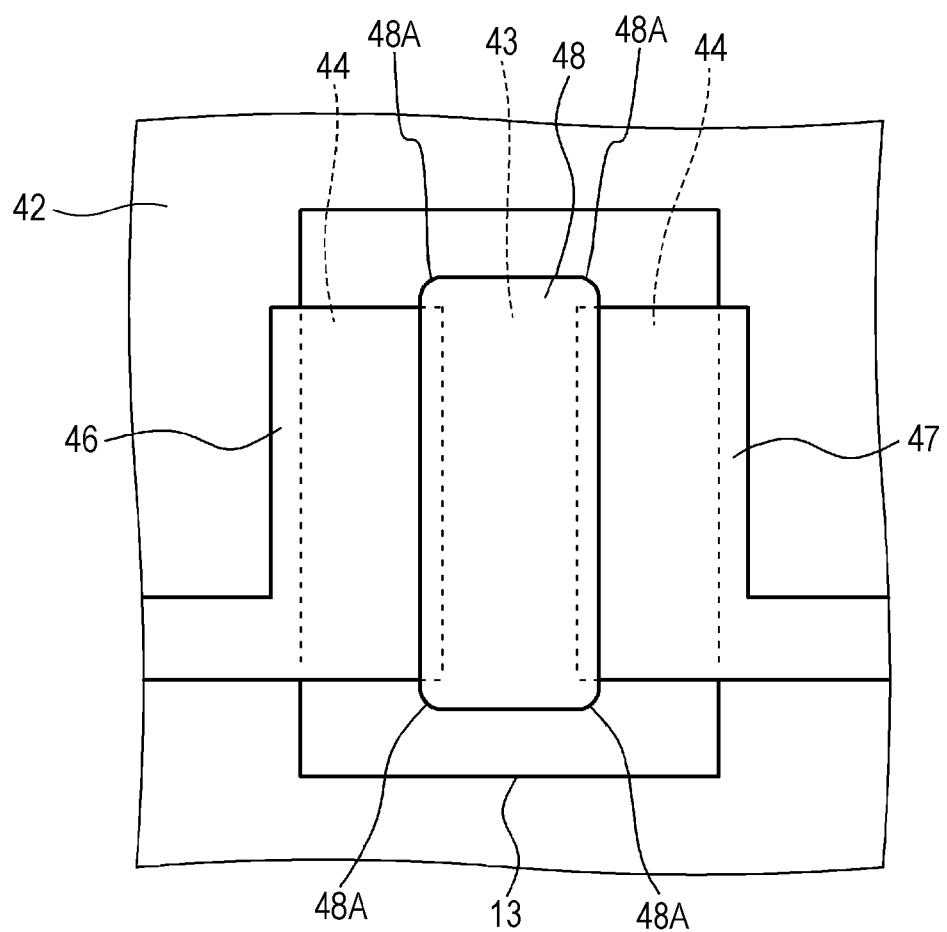

A schematic partial sectional view of a modification example of the electronic device of Example 3 is illustrated in FIG. 10A, and a schematic view which illustrates an arrangement of the functional layer or the like is illustrated in FIG. 10B. In the modification example, the protective film 48 is formed on a part of the functional layer extension portion 44 and on the functional layer 43. Furthermore, the protective film 48 may be formed on the functional layer 43.

Figure 11A:
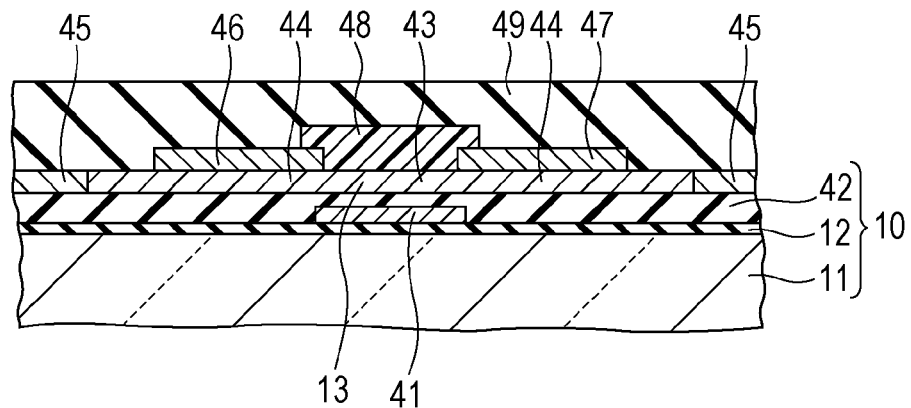
Figure 11B:
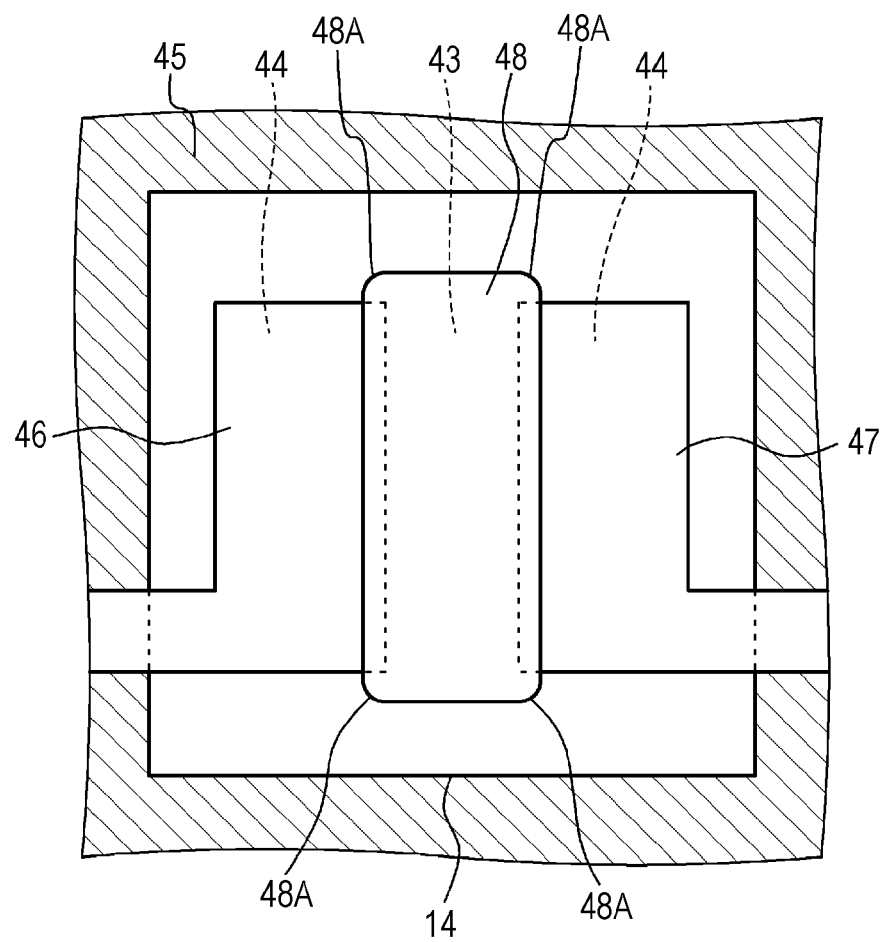
Figure 12A:
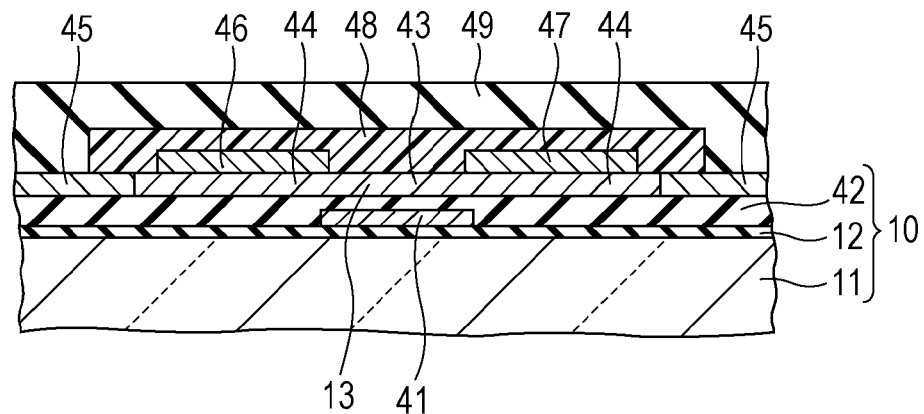
Figure 12B:
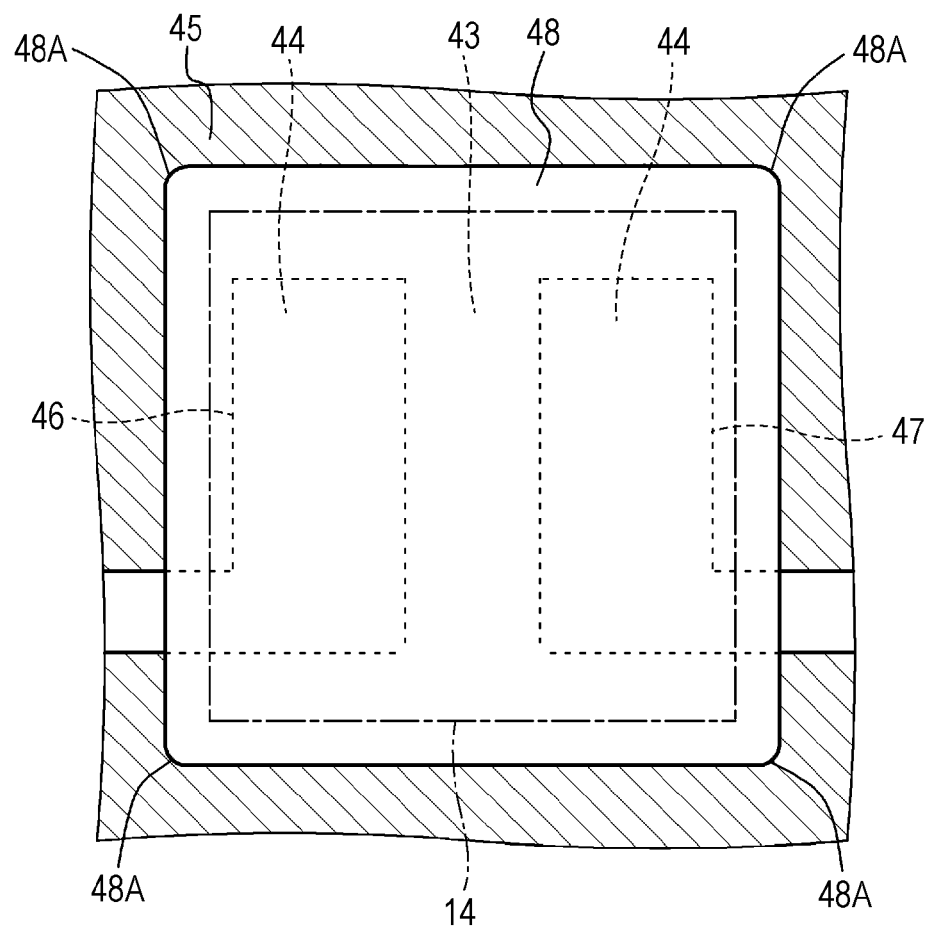

Alternatively, a schematic partial sectional view of the modification example of the electronic device of Example 3 is illustrated in FIG. 11A and FIG. 12A, and a schematic view which illustrates an arrangement of the functional layer or the like is illustrated in FIG. 11B and FIG. 12B. In the modification example, the inactive region 45 made of the organic semiconductor material layer 13, in which the inactive process is performed, extends from the functional layer extension portion 44. In FIG. 11B and FIG. 12B, in order to specify the inactive region 45, diagonal lines are applied to the inactive region 45. Here, in an example illustrated in FIG. 11A and FIG. 11B, the protective film 48 is formed on a part of the functional layer extension portion 44 and on the functional layer 43, and in an example illustrated in FIG. 12A and FIG. 12B, the protective film 48 covers the functional layer 43 and the functional layer extension portion 44. Furthermore, the protective film 48 may be formed on the functional layer 43.

EXAMPLE 4

Figure 13A:
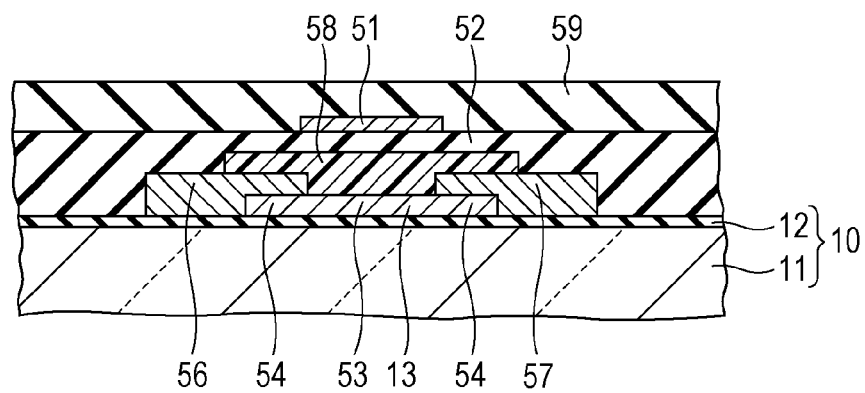
Figure 13B:
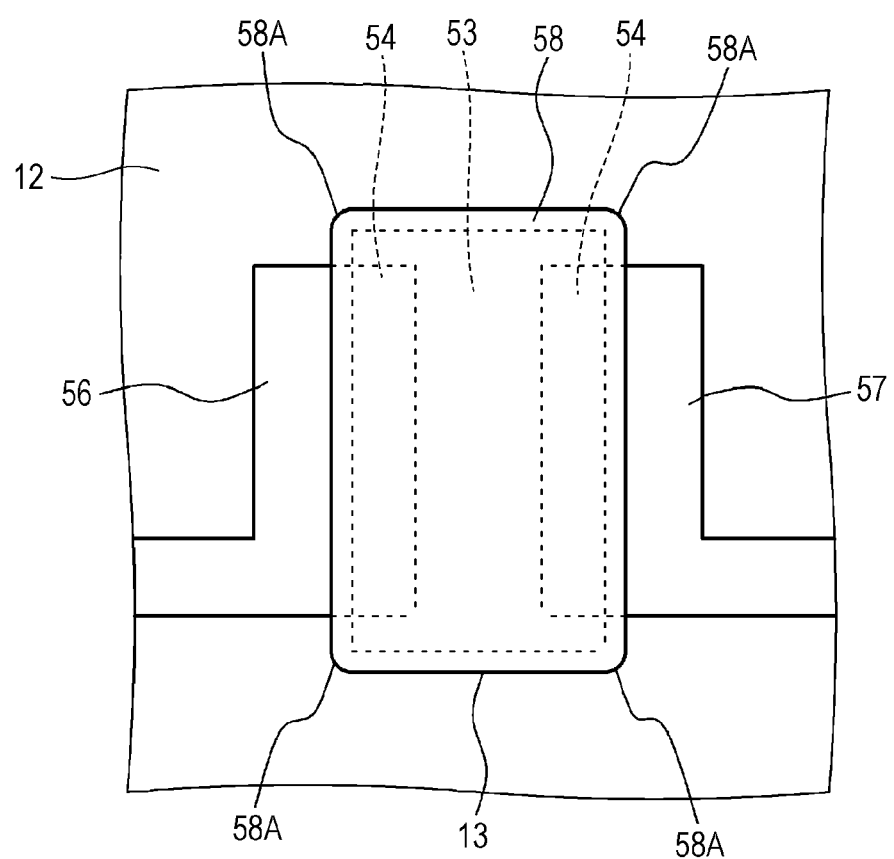

Example 4 has a configuration modified from Example 3, and relates to a top contact/top gate-type electronic device. A schematic partial sectional view of the electronic device of Example 4 which is similarly cut along line A-A of FIG. 1B is illustrated in FIG. 13A, and a schematic view which illustrates an arrangement of the functional layer or the like is illustrated in FIG. 13B, and in the electronic device of Example 4, a control electrode 51 which faces the functional layer 53 through the insulating layer 52 is further included. Specifically, the electronic device of Example 4 is the top contact/top gate-type thin film transistor (TFT), the control electrode 51 corresponds to the gate electrode, the insulating layer 52 corresponds to the gate insulating layer, the first electrode 56 and the second electrode 57 correspond to the source/drain electrode, and the functional layer 53 corresponds to the channel forming region.

Then, in the electronic device of Example 4, the outline of the functional layer extension portion 54 is configured to have the closed curve. Specifically, the outline of the functional layer extension portion 54 is rectangular. The functional layer extension portion 54 is formed on a part of the first electrode 56 and the second electrode 57. The protective film 58 covers the functional layer 53 and the functional layer extension portion 54 (refer to FIG. 13B).

Hereinafter, a manufacturing method of the electronic device of Example 4 will be described with reference to a schematic partial sectional view of the base or the like of FIG. 20A, FIG. 20B, and FIG. 20C. Furthermore, the schematic partial sectional view is similar to a partial sectional view cut along line A-A of FIG. 1B.

Process-400

Figure 20A:
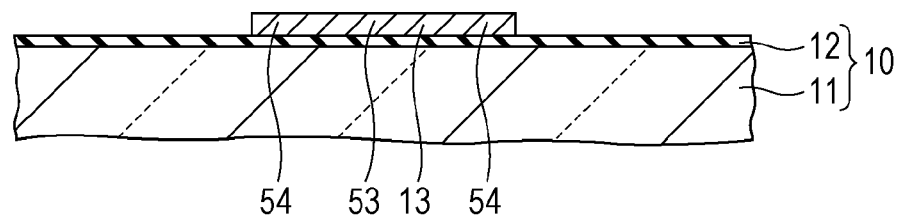
FIG. 20A, FIG. 20B, and FIG. 20C are schematic partial sectional views of a base or the like for describing an electronic device manufacturing method according to Example 4.
Figure 20B:
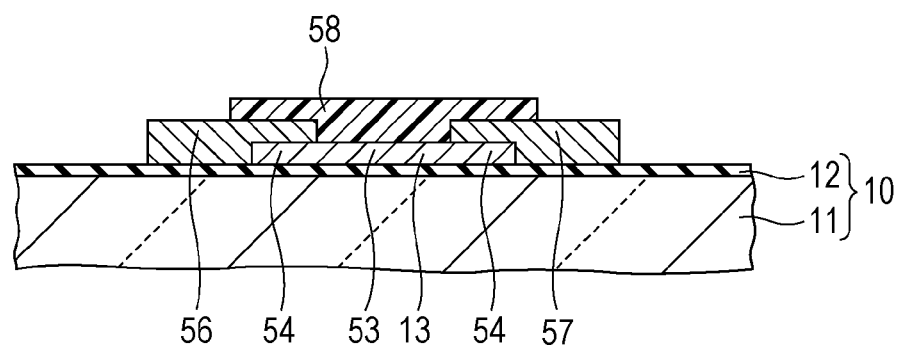
Figure 20C:
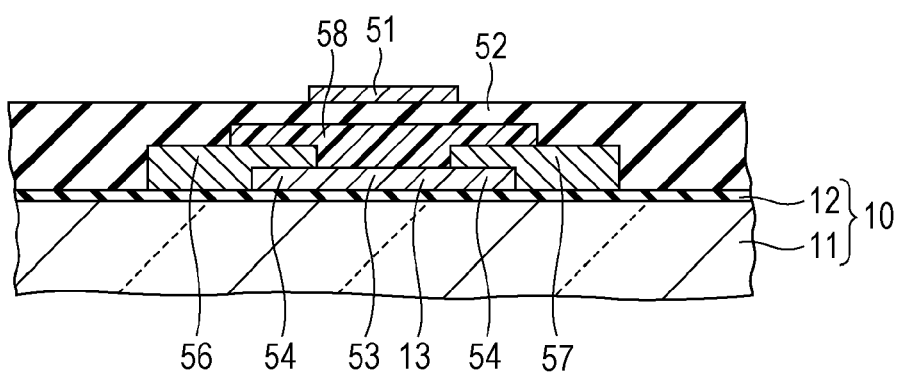

First, similar to Process-130 of Example 1, the functional layer 53 and the functional layer extension portion 54 which are made of the organic semiconductor material layer 13 are formed on the insulating film 12 formed on the substrate for manufacturing an electronic device 11 (refer to FIG. 20A).

Process-410

Next, similar to Process-120 of Example 1, the first electrode 56 and the second electrode 57 (a pair of source/drain electrodes) are formed on the functional layer extension portion 54 and the insulating film 12.

Process-420

Subsequently, similar to Process-140 of Example 1, the protective film 58 for covering the functional layer 53, the functional layer extension portion 54, the first electrode 56, and the second electrode 57, is formed. Thus, a structure illustrated in FIG. 20B is able to be obtained.

Process-430

Next, similar to Process-110 of Example 1, the insulating layer (the gate insulating layer) 52 is formed on the protective film 58, the first electrode 56, the second electrode 57, and the insulating film 12.

However, at the time of forming the insulating layer 52, generally, the solution (the solution for insulating layer) for forming the insulating layer 52 is dropped on the center of the substrate for manufacturing an electronic device 11, and the substrate for manufacturing an electronic device 11 is rotated. At this time, the solution for insulating layer spreads from the center of the substrate for manufacturing an electronic device 11 toward the circumferential portion. When the vertex portion (the corner portion) 58A of the protective film 58 is not chamfered, the solution for insulating layer penetrates between the vertex portion 58A of the protective film 58 and the foundation (for example, the insulating film 12), and the protective film 58 may be peeled off from the foundation. However, since the vertex portion 58A of the protective film 58 is chamfered, it is possible to reliably prevent the solution for insulating layer from penetrating between the vertex portion 58A of the protective film 58 and the foundation, the protective film 58 is not peeled off from the foundation, and thus the electronic device having high reliability is able to be obtained.

Process-440

Subsequently, similar to Process-100 of Example 1, the gate electrode 51 is formed on the insulating layer (the gate insulating layer) 52. Thus, a structure illustrated in FIG. 20C is able to be obtained.

Process-450

Next, the passivation film 58 is formed on the entire surface on the basis of the spin coat method. Thus, the electronic device (the top contact/top gate-type thin film transistor) of Example 4 of the structure illustrated in FIG. 13A is able to be obtained. Alternatively, the substrate for configuring an image display apparatus and the image display apparatus which are provided with the electronic device (TFT) of Example 4 are able to be obtained.

Process-460

For example, in the manufacture of the image display apparatus, similar to Process-160 of Example 1, the image display apparatus is further able to be manufactured.

Figure 14A:
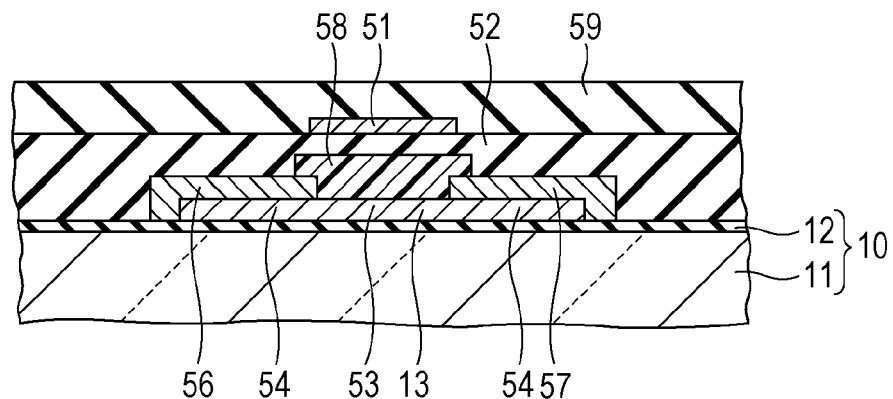
Figure 14B:
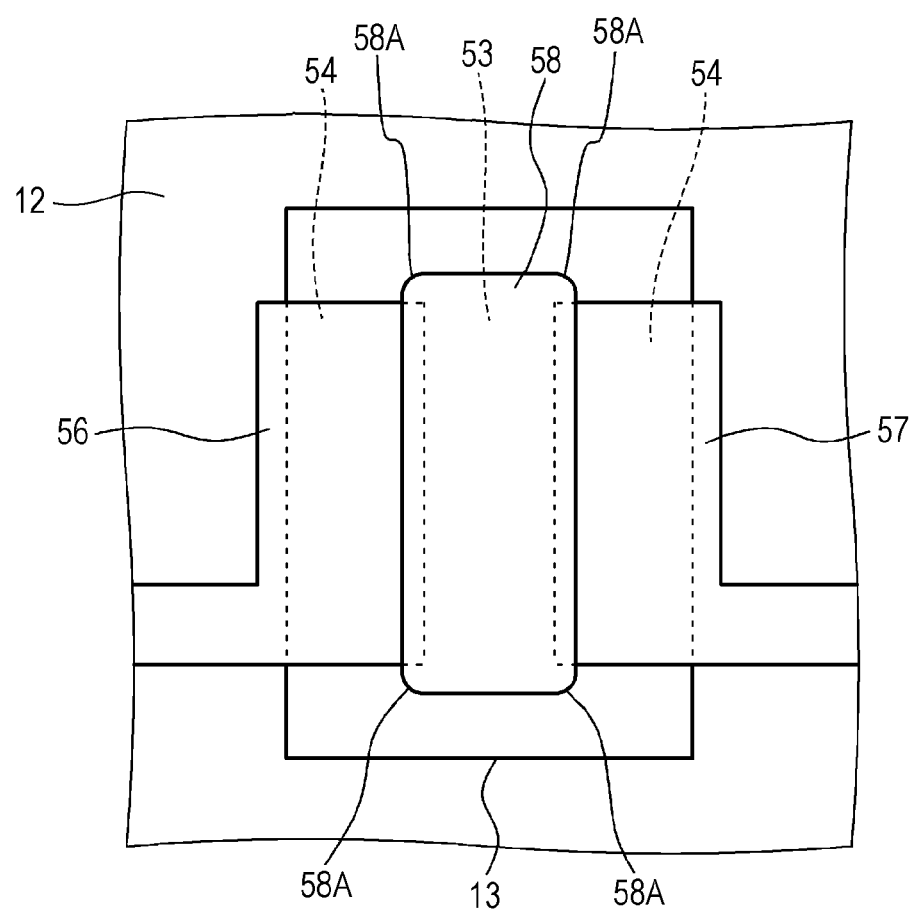

A schematic partial sectional view of a modification example of the electronic device of Example 4 is illustrated in FIG. 14A, and a schematic view which illustrates an arrangement of the functional layer or the like is illustrated in FIG. 14B. In the modification example, the protective film 58 is formed on a part of the functional layer extension portion 54 and on the functional layer 53. Furthermore, the protective film 58 may be formed on the functional layer 53.

Figure 15A:
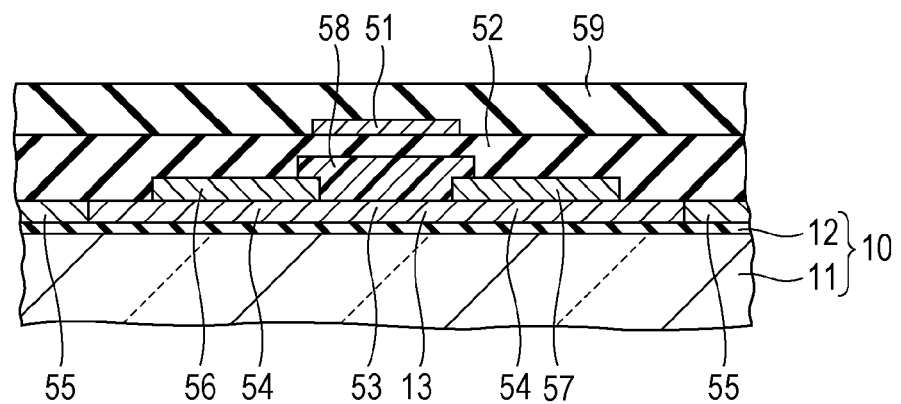
Figure 15B:
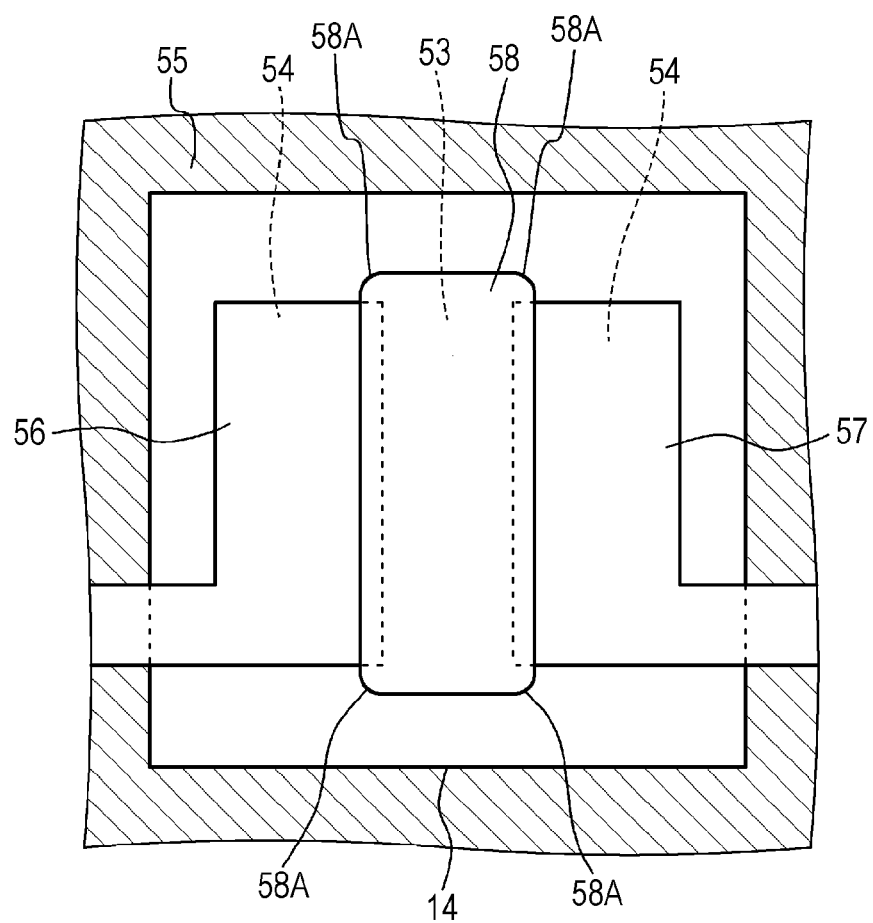
Figure 16A:
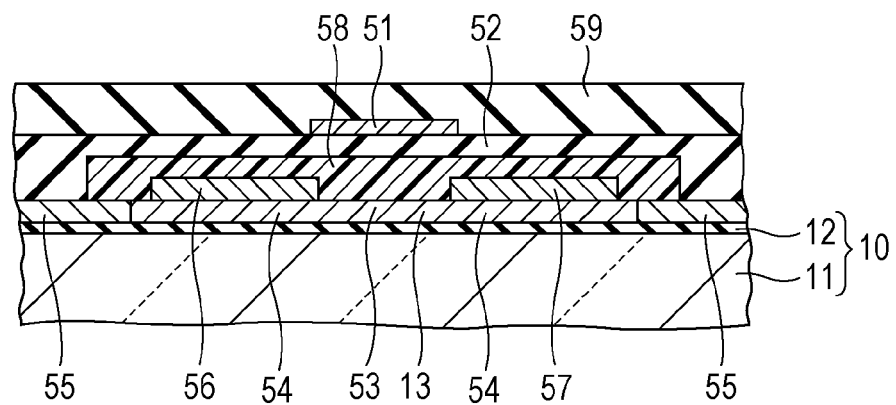
Figure 16B:
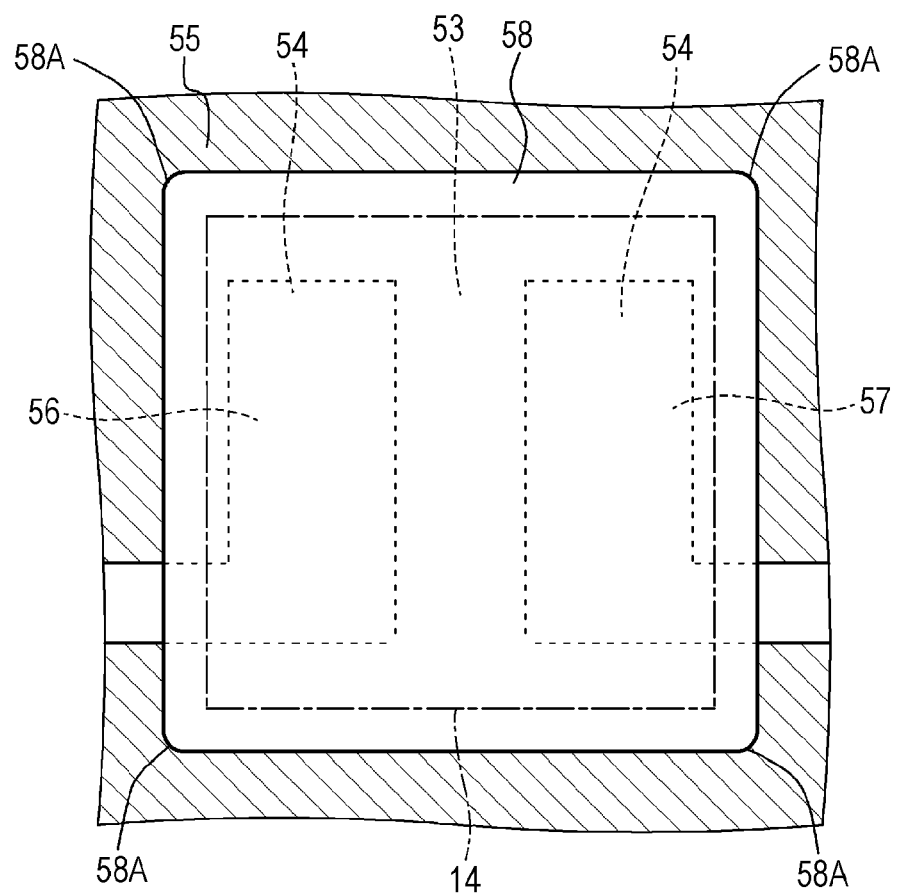

Alternatively, a schematic partial sectional view of the modification example of the electronic device of Example 4 is illustrated in FIG. 15A, and FIG. 16A, and a schematic view which illustrates an arrangement of the functional layer or the like is illustrated in FIG. 15B, and FIG. 16B. In the modification example, the inactive region 55 made of the organic semiconductor material layer 13, in which the inactive process is performed, extends from the functional layer extension portion 54. In FIG. 15B and FIG. 16B, in order to specify the inactive region 55, diagonal lines are applied to the inactive region 55. Here, in an example illustrated in FIG. 15A and FIG. 15B, the protective film 58 is formed on a part of the functional layer extension portion 54 and on the functional layer 53, and in an example illustrated in FIG. 16A and FIG. 16B, the protective film 58 covers the functional layer 53 and the functional layer extension portion 54. Furthermore, the protective film 58 may be formed on the functional layer 53.

EXAMPLE 5

Figure 21A:
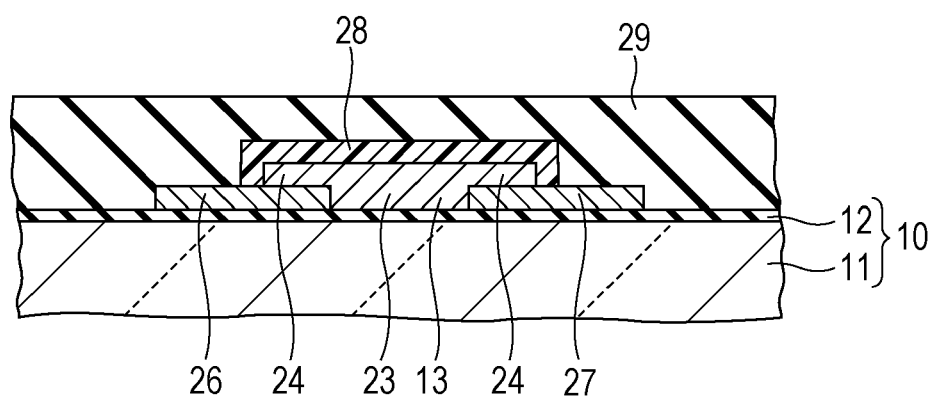
FIG. 21A and FIG. 21B are schematic partial sectional views of an electronic device according to Example 5.
Figure 21B:
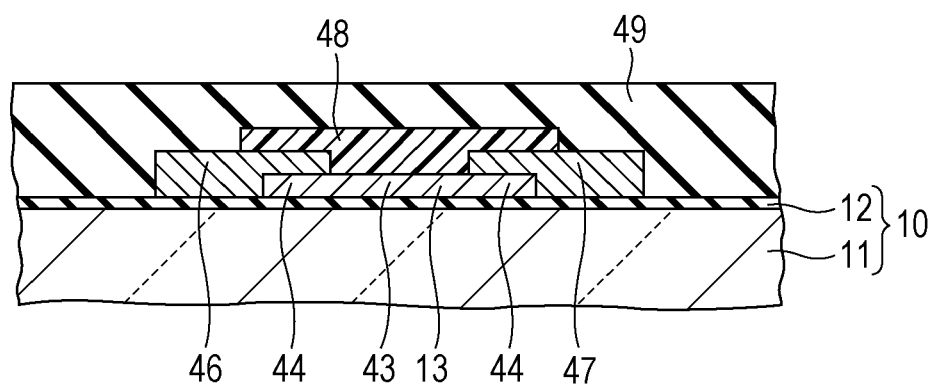

In Example 1 to Example 4, the electronic device of the present disclosure is described only by the 3-terminal electronic device, but the electronic device may be a 2-terminal electronic device. As illustrated in the schematic partial sectional view of FIG. 21A, the 2-terminal electronic device includes the first electrode 26 and the second electrode 27 which are separately formed on the base 10, the functional layer 23 which is made of the organic semiconductor material layer 13, and is formed on the base 10 between the first electrode 26 and the second electrode 27, the functional layer extension portion 24 which is made of the organic semiconductor material layer 13, and extends from the functional layer 23, the protective film 28 which is formed at least on the functional layer 23, and the insulating layer 29 which covers the entire surface. Alternatively, as illustrated in the schematic partial sectional view of FIG. 21B, the 2-terminal electronic device includes the functional layer 43 which is made of the organic semiconductor material layer 13, and is formed on the base 10, the functional layer extension portion 44 which is made of the organic semiconductor material layer 13, and extends from the functional layer 43, the first electrode 46 and the second electrode 47 which are separately formed on the functional layer extension portion 44 and interpose the functional layer 43 therebetween, the protective film 48 which is formed at least on the functional layer 43, and the insulating layer 49 which covers the entire surface. Then, the protective films 28 and 48 are patterned to include at least two sides intersecting with each other at an acute angle, and the vertex portions of the protective films 28 and 48 in which the two sides intersect with each other are chamfered.

By suitably selecting a material for configuring the organic semiconductor material layer 13, the substrate for manufacturing an electronic device 11, and the electrodes 66 and 67, the 2-terminal electronic device is able to function as a light sensor or a photoelectric conversion element (specifically, a solar cell or an image sensor), or a light-emitting element, and thus is able to function as a sensor.

Specifically, it is possible to configure the light sensor by using a pigment having absorbency with respect to light (including not only visible light, but also ultraviolet ray or infrared ray) as the organic semiconductor molecule for configuring the organic semiconductor material layer 13, and it is possible to configure the photoelectric conversion element (specifically, the solar cell or the image sensor) in which current flows between the first electrode 66 and the second electrode 67 due to the light (including not only visible light, but also ultraviolet ray or infrared ray) irradiation with respect to the organic semiconductor material layer 13.

As described above, the present disclosure is described on the basis of the preferable embodiments, but the present disclosure is not limited to the embodiment. The structure or the configuration, the shape, the forming conditions, and the manufacturing conditions of the electronic device, the image display apparatus, and the substrate for configuring an image display apparatus are exemplifications, and may be suitably changed. When the electronic device of the present disclosure is applied to and used in, for example, the display apparatus or the various electronic apparatus, the electronic device of the present disclosure may be the monolithic integrated circuit in which a plurality of electronic devices are integrated in the base or the supporting member, and may be used as the discrete component by cutting out each electronic device to be individualized.

A sensor may be configured by the electronic device described in Example 1 to Example 4. For example, specifically, the light-emitting element is configured by the electronic device. That is, the light-emitting element (the organic light-emitting element, and the organic light-emitting transistor) in which the organic semiconductor material layer emits light by applying voltage to the control electrode, the first electrode, and the second electrode, is configured. Then, according to the voltage applied to the control electrode, the current which flows from the first electrode to the organic semiconductor material layer toward the second electrode is controlled. When positive holes are sufficiently accumulated, and bias with respect to the first electrode and the second electrode increases, electron injection begins, and the light is emitted by recoupling the electrons with the positive holes.

Furthermore, the present disclosure may be configured as the following.

(A01) Electronic Device

First Embodiment

An electronic device, including:

a first electrode and a second electrode which are separately formed on a base;

a functional layer which is made of an organic semiconductor material layer, and is formed on the base between the first electrode and the second electrode;

a functional layer extension portion which is made of the organic semiconductor material layer, and extends from the functional layer;

a protective film which is formed at least on the functional layer; and an insulating layer which covers an entire surface, in which the protective film is patterned to include at least two sides which intersect with each other at an acute angle, and a vertex portion of the protective film in which the two sides intersect with each other, is chamfered.

(A02) The electronic device according to (A01), in which all of the vertex portions of the protective film in which the sides intersect with each other at an acute angle, are chamfered.

(A03) The electronic device according to (A01) or (A02), in which an outline of the functional layer extension portion is configured to have a closed curve, and the protective film covers the functional layer and the functional layer extension portion, or is formed on a part of the functional layer extension portion and on the functional layer, or is formed on the functional layer.

(A04) The electronic device according to (A01) or (A02), in which an inactive region made of the organic semiconductor material layer in which an inactive process is performed, extends from the functional layer extension portion.

(A05) The electronic device according to (A04), in which the inactive region is obtained by laser irradiation in which irradiation conditions are optimized.

(A06) The electronic device according to (A04) or (A05),
in which the protective film covers the functional layer and the functional layer extension portion, or is formed on a part of the functional layer extension portion and on the functional layer, or is formed on the functional layer.

(A07) The electronic device according to any one of (A01) to (A06),
in which the base includes a control electrode formed on a substrate for manufacturing an electronic device, and an interlayer insulating layer for covering the control electrode, and
the control electrode faces the functional layer through the interlayer insulating layer.

(A08) The electronic device according to (A07),
in which the electronic device is a thin film transistor,
the control electrode corresponds to a gate electrode,
the interlayer insulating layer corresponds to a gate insulating layer,
the first electrode and the second electrode correspond to a source/drain electrode, and
the functional layer corresponds to a channel forming region.

(A09) The electronic device according to any one of (A01) to (A06), further including:
a control electrode which faces the functional layer through the insulating layer.

(A10) The electronic device according to (A09),
in which the electronic device is a thin film transistor,
the control electrode corresponds to a gate electrode,
the insulating layer corresponds to a gate insulating layer,
the first electrode and the second electrode correspond to a source/drain electrode, and
the functional layer corresponds to a channel forming region.

(B01) Electronic Device

Second Embodiment

An electronic device, including:
a functional layer which is made of an organic semiconductor material layer, and is formed on a base;
a functional layer extension portion which is made of the organic semiconductor material layer, and extends from the functional layer;
a first electrode and a second electrode which are separately formed on the functional layer extension portion and interpose the functional layer therebetween;
a protective film which is formed at least on the functional layer; and
an insulating layer which covers an entire surface,
in which the protective film is patterned to include at least two sides which intersect with each other at an acute angle, and
a vertex portion of the protective film in which the two sides intersect with each other, is chamfered.

(B02) The electronic device according to (B01),
in which all of the vertex portions of the protective film in which the sides intersect with each other at an acute angle, are chamfered.

(B03) The electronic device according to (B01) or (B02),
in which an outline of the functional layer extension portion is configured to have a closed curve, and
the protective film covers the functional layer and the functional layer extension portion, or is formed on a part of the functional layer extension portion and on the functional layer, or is formed on the functional layer.

(B04) The electronic device according to any one of (B01) to (B03),
in which an inactive region made of the organic semiconductor material layer in which an inactive process is performed, extends from the functional layer extension portion.

(B05) The electronic device according to (B04),
in which the inactive region is obtained by laser irradiation in which irradiation conditions are optimized.

(B06) The electronic device according to any one of (B01) to (B05),
in which the base includes a control electrode formed on a substrate for manufacturing an electronic device, and an interlayer insulating layer for covering the control electrode, and
the control electrode faces the functional layer through the interlayer insulating layer.

(B07) The electronic device according to (B06),
in which the electronic device is a thin film transistor,
the control electrode corresponds to a gate electrode,
the interlayer insulating layer corresponds to a gate insulating layer,
the first electrode and the second electrode correspond to a source/drain electrode, and
the functional layer corresponds to a channel forming region.

(B08) The electronic device according to any one of (B01) to (B05), further including:
a control electrode which faces the functional layer through the insulating layer.

(B09) The electronic device according to (B08),
in which the electronic device is a thin film transistor,
the control electrode corresponds to a gate electrode,
the insulating layer corresponds to a gate insulating layer,
the first electrode and the second electrode correspond to a source/drain electrode, and
the functional layer corresponds to a channel forming region.

(C01) Substrate for Configuring Image Display Apparatus

A substrate for configuring an image display apparatus, in which a plurality of the electronic devices according to any one of (A01) to (B09) are arranged in the shape of a 2-dimensional matrix in a first direction and a second direction.

(C02) The substrate for configuring an image display apparatus according to (C01),
in which the control electrode of the plurality of electronic devices which are arranged along the first direction is connected to gate wiring extending along the first direction, and
the first electrode or the second electrode of the plurality of electronic devices which are arranged along the second direction is connected to signal wiring extending along the second direction.

(D01) Image Display Apparatus

An image display apparatus, including:
the substrate for configuring an image display apparatus according to (C01) or (C02).

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device, comprising:
   a first electrode and a second electrode which are separately formed on a base;
   a functional layer which includes an organic semiconductor material layer, and is formed on the base between the first electrode and the second electrode;
   a functional layer extension portion which includes the organic semiconductor material layer, and extends from the functional layer;
   a protective film which is formed at least on the functional layer; and
   an insulating layer which covers an entire surface, including a surface of the protective film,
   wherein the protective film is patterned to include a top surface and at least two sides which extend from the top surface toward the base and are perpendicular to the base and which intersect with each other at an acute angle, and
   a corner portion of the protective film, in which the two sides intersect with each other, is chamfered.

2. The electronic device according to claim 1,
   wherein all of the corner portions of the protective film in which the sides intersect with each other at an acute angle, are chamfered.

3. The electronic device according to claim 1,
   wherein an outline of the functional layer extension portion is configured to have a closed curve, and
   the protective film covers the functional layer and the functional layer extension portion, or is formed on a part of the functional layer extension portion and on the functional layer, or is formed on the functional layer.

4. The electronic device according to claim 1,
   wherein an inactive region including the organic semiconductor material layer in which an inactive process is performed, extends from the functional layer extension portion.

5. The electronic device according to claim 4,
   wherein the protective film covers the functional layer and the functional layer extension portion, or is formed on a part of the functional layer extension portion and on the functional layer, or is formed on the functional layer.

6. The electronic device according to claim 1,
   wherein the base includes a control electrode formed on a substrate for manufacturing an electronic device, and an interlayer insulating layer for covering the control electrode, and
   the control electrode faces the functional layer through the interlayer insulating layer.

7. The electronic device according to claim 1, further comprising:
   a control electrode which faces the functional layer through the insulating layer.

8. An electronic device, comprising:
   a functional layer which includes an organic semiconductor material layer, and is formed on a base;
   a functional layer extension portion which includes the organic semiconductor material layer, and extends from the functional layer;
   a first electrode and a second electrode which are separately formed on the functional layer extension portion and interpose the functional layer therebetween;
   a protective film which is formed at least on the functional layer; and
   an insulating layer which covers an entire surface, including a surface of the protective film,
   wherein the protective film is patterned to include a top surface and at least two sides which extend from the top surface toward the base and are perpendicular to the base and which intersect with each other at an acute angle, and
   a corner portion of the protective film, in which the two sides intersect with each other, is chamfered.

9. The electronic device according to claim 8,
   wherein all of the corner portions of the protective film in which the sides intersect with each other at an acute angle, are chamfered.

10. The electronic device according to claim 8,
    wherein an outline of the functional layer extension portion is configured to have a closed curve, and
    the protective film covers the functional layer and the functional layer extension portion, or is formed on a part of the functional layer extension portion and on the functional layer, or is formed on the functional layer.

11. The electronic device according to claim 8,
    wherein an inactive region including the organic semiconductor material layer in which an inactive process is performed, extends from the functional layer extension portion.

12. The electronic device according to claim 8,
    wherein the base includes a control electrode formed on a substrate for manufacturing an electronic device, and an interlayer insulating layer for covering the control electrode, and
    the control electrode faces the functional layer through the interlayer insulating layer.

13. The electronic device according to claim 8, further comprising:
    a control electrode which faces the functional layer through the insulating layer.

14. A substrate for configuring an image display apparatus, in which a plurality of the electronic devices according to claim 1 are arranged in the shape of a 2-dimensional matrix in a first direction and a second direction.

15. An image display apparatus, comprising:
    the substrate for configuring an image display apparatus according to claim 14.

* * * * *